(12) United States Patent
Segal et al.

(10) Patent No.: US 7,342,818 B2
(45) Date of Patent: Mar. 11, 2008

(54) HYBRID CIRCUIT HAVING NANOTUBE ELECTROMECHANICAL MEMORY

(75) Inventors: Brent M. Segal, Woburn, MA (US);
Darren K. Brock, Elmsford, NY (US);
Thomas Rueckes, Rockport, MA (US)

(73) Assignee: Nantero, Inc., Woburn, MA (US)

( * ) Notice: Subject to any disclaimer, the term of this patent is extended or adjusted under 35 U.S.C. 154(b) by 246 days.

(21) Appl. No.: 10/964,150

(22) Filed: Oct. 13, 2004

(65) Prior Publication Data

US 2005/0063210 A1 Mar. 24, 2005

Related U.S. Application Data

(63) Continuation of application No. 10/379,973, filed on Mar. 5, 2003, now Pat. No. 6,836,424, which is a continuation of application No. 09/915,095, filed on Jul. 25, 2001, now Pat. No. 6,574,130.

(51) Int. Cl.
*G11C 11/00* (2006.01)

(52) U.S. Cl. .................. 365/129; 365/151; 977/942

(58) Field of Classification Search ............ 365/129, 365/151; 977/742, 942
See application file for complete search history.

(56) References Cited

U.S. PATENT DOCUMENTS

| | | |
|---|---|---|
| 3,448,302 A | 6/1969 | Shanefield |
| 3,740,494 A | 6/1973 | Dunand et al. |
| 3,892,890 A | 7/1975 | Watanabe et al. |
| 3,970,887 A | 7/1976 | Smith et al. |
| 4,324,814 A | 4/1982 | Reichert |
| 4,378,629 A | 4/1983 | Bozlev et al. |
| 4,495,511 A | 1/1985 | Yoder |
| 4,510,016 A | 4/1985 | Chi et al. |
| 4,524,431 A | 6/1985 | Haken et al. |
| 4,673,474 A | 6/1987 | Ogawa |
| 4,694,427 A | 9/1987 | Miyamoto et al. |
| 4,701,842 A | 10/1987 | Olnowich |
| 4,707,197 A | 11/1987 | Hensel et al. |
| 4,758,534 A | 7/1988 | Derkits, Jr. et al. |
| 4,819,212 A | 4/1989 | Nakai et al. |

(Continued)

FOREIGN PATENT DOCUMENTS

DE 4446289 6/1996

(Continued)

OTHER PUBLICATIONS

Winslow, Troy. "Advanced+ Boot Block World's First 0.18-Micron Flash Memory." Flash Products Group. Apr. 17, 2000.

(Continued)

*Primary Examiner*—Son Dinh
(74) *Attorney, Agent, or Firm*—Wilmer Cutler Pickering Hale and Dorr LLP

(57) ABSTRACT

A hybrid memory system having electromechanical memory cells is disclosed. A memory cell core circuit has an array of electromechanical memory cells, in which each cell is a crossbar junction at least one element of which is a nanotube or a nanotube ribbon. An access circuit provides array addresses to the memory cell core circuit to select at least one corresponding cell. The access circuit is constructed of semiconductor circuit elements.

9 Claims, 16 Drawing Sheets

U.S. PATENT DOCUMENTS

| | | |
|---|---|---|
| 4,845,533 A | 7/1989 | Pryor et al. |
| 4,853,893 A | 8/1989 | Eaton, Jr. et al. |
| 4,876,667 A | 10/1989 | Ross et al. |
| 4,888,630 A | 12/1989 | Paterson |
| 4,893,281 A * | 1/1990 | Hashimoto ............. 365/230.06 |
| 4,901,121 A | 2/1990 | Gibson et al. |
| 4,903,090 A | 2/1990 | Yokoyama |
| 4,939,556 A | 7/1990 | Eguchi et al. |
| 4,947,226 A | 8/1990 | Huang et al. |
| 4,979,149 A | 12/1990 | Popovic et al. |
| 4,985,871 A | 1/1991 | Catlin |
| 5,010,037 A | 4/1991 | Lin et al. |
| 5,031,145 A | 7/1991 | Lever |
| 5,032,538 A | 7/1991 | Bozler et al. |
| 5,051,956 A | 9/1991 | Burns |
| 5,057,883 A | 10/1991 | Noda |
| 5,089,545 A | 2/1992 | Pol |
| 5,155,561 A | 10/1992 | Bozler et al. |
| 5,161,218 A | 11/1992 | Catlin |
| 5,168,070 A | 12/1992 | Luth |
| 5,175,597 A | 12/1992 | Cachier et al. |
| 5,184,320 A | 2/1993 | Dye |
| 5,196,396 A | 3/1993 | Lieber |
| 5,198,390 A | 3/1993 | MacDonald et al. |
| 5,198,994 A | 3/1993 | Natori |
| 5,216,631 A | 6/1993 | Sliwa |
| 5,252,835 A | 10/1993 | Lieber et al. |
| 5,271,862 A | 12/1993 | Freese |
| 5,290,715 A | 3/1994 | Pardya |
| 5,316,979 A | 5/1994 | MacDonald et al. |
| 5,346,683 A | 9/1994 | Green et al. |
| 5,412,785 A | 5/1995 | Skruhak et al. |
| 5,424,054 A | 6/1995 | Bethune et al. |
| 5,426,070 A | 6/1995 | Shaw et al. |
| 5,444,421 A | 8/1995 | Carroll et al. |
| 5,444,651 A | 8/1995 | Yamamoto et al. |
| 5,453,970 A | 9/1995 | Rust et al. |
| 5,456,986 A | 10/1995 | Majetich et al. |
| 5,475,341 A | 12/1995 | Reed |
| 5,479,172 A | 12/1995 | Smith et al. |
| 5,482,601 A | 1/1996 | Ohshima et al. |
| 5,517,194 A | 5/1996 | Carroll et al. |
| 5,521,602 A | 5/1996 | Carroll et al. |
| 5,533,061 A | 7/1996 | Smith et al. |
| 5,538,916 A | 7/1996 | Kuroi et al. |
| 5,547,748 A | 8/1996 | Ruoff et al. |
| 5,553,099 A | 9/1996 | Carroll et al. |
| 5,563,424 A | 10/1996 | Yang et al. |
| 5,586,286 A | 12/1996 | Santeler et al. |
| 5,589,692 A | 12/1996 | Reed |
| 5,590,078 A | 12/1996 | Chatter |
| 5,591,312 A | 1/1997 | Smalley |
| 5,592,642 A | 1/1997 | Thomas |
| 5,592,643 A | 1/1997 | Thomas |
| 5,592,644 A | 1/1997 | Thomas |
| 5,608,246 A | 3/1997 | Yeager et al. |
| 5,608,888 A | 3/1997 | Purcell et al. |
| 5,623,638 A | 4/1997 | Andrade |
| 5,626,670 A | 5/1997 | Varshney et al. |
| 5,626,812 A | 5/1997 | Ebbesen et al. |
| 5,640,133 A | 6/1997 | MacDonald et al. |
| 5,640,343 A | 6/1997 | Gallagher et al. |
| 5,650,958 A | 7/1997 | Gallagher et al. |
| 5,651,126 A | 7/1997 | Bailey et al. |
| 5,652,856 A | 7/1997 | Santeler et al. |
| 5,676,865 A | 10/1997 | Chang |
| 5,699,317 A | 12/1997 | Sartore et al. |
| 5,716,708 A | 2/1998 | Lagow |
| 5,719,073 A | 2/1998 | Shaw et al. |
| 5,721,862 A | 2/1998 | Sartore et al. |
| 5,739,057 A | 4/1998 | Tiwari et al. |
| 5,747,180 A | 5/1998 | Miller et al. |
| 5,751,156 A | 5/1998 | Muller et al. |
| 5,753,088 A | 5/1998 | Olk |
| 5,780,101 A | 7/1998 | Nolan et al. |
| 5,781,717 A | 7/1998 | Wu et al. |
| 5,793,697 A | 8/1998 | Scheuerlein |
| 5,799,209 A | 8/1998 | Chatter |
| 5,802,583 A | 9/1998 | Yeager et al. |
| 5,829,125 A | 11/1998 | Fujimoto et al. |
| 5,838,165 A | 11/1998 | Chatter |
| 5,840,435 A | 11/1998 | Lieber et al. |
| 5,841,692 A | 11/1998 | Gallagher et al. |
| 5,846,849 A | 12/1998 | Shaw et al. |
| 5,847,454 A | 12/1998 | Shaw et al. |
| 5,847,565 A | 12/1998 | Narayanan |
| 5,850,089 A | 12/1998 | Varshney et al. |
| 5,850,231 A | 12/1998 | Orimoto et al. |
| 5,858,862 A | 1/1999 | Westwater et al. |
| 5,875,451 A | 2/1999 | Joseph |
| 5,878,840 A | 3/1999 | Tessum et al. |
| 5,887,272 A | 3/1999 | Sartore et al. |
| 5,897,945 A | 4/1999 | Lieber et al. |
| 5,903,010 A | 5/1999 | Flory et al. |
| 5,909,624 A | 6/1999 | Yeager et al. |
| 5,914,553 A | 6/1999 | Adams et al. |
| 5,925,465 A | 7/1999 | Ebbesen et al. |
| 5,928,450 A | 7/1999 | Russell |
| 5,930,164 A | 7/1999 | Zhu |
| 5,939,785 A | 8/1999 | Klonis et al. |
| 5,946,228 A | 8/1999 | Abraham et al. |
| 5,946,930 A | 9/1999 | Anthony |
| 5,973,444 A | 10/1999 | Xu et al. |
| 5,985,446 A | 11/1999 | Lagow |
| 5,993,697 A | 11/1999 | Cohen et al. |
| 5,994,733 A | 11/1999 | Nishioka et al. |
| 5,997,832 A | 12/1999 | Lieber et al. |
| 6,025,618 A | 2/2000 | Chen |
| 6,031,711 A | 2/2000 | Tennent et al. |
| 6,031,756 A | 2/2000 | Gimzewski et al. |
| 6,036,774 A | 3/2000 | Lieber et al. |
| 6,038,060 A | 3/2000 | Crowley |
| 6,038,637 A | 3/2000 | Berube et al. |
| 6,044,008 A | 3/2000 | Choi |
| 6,048,740 A | 4/2000 | Hsu et al. |
| 6,049,856 A | 4/2000 | Bolyn |
| 6,051,866 A | 4/2000 | Shaw et al. |
| 6,052,263 A | 4/2000 | Gill |
| 6,052,313 A | 4/2000 | Atsumi et al. |
| 6,057,637 A | 5/2000 | Zettl et al. |
| 6,060,724 A | 5/2000 | Flory et al. |
| 6,062,931 A | 5/2000 | Chuang et al. |
| 6,063,243 A | 5/2000 | Zettl et al. |
| 6,064,107 A | 5/2000 | Yeh et al. |
| 6,069,380 A | 5/2000 | Chou et al. |
| 6,072,718 A | 6/2000 | Abraham et al. |
| 6,083,624 A | 7/2000 | Hiura |
| 6,087,293 A | 7/2000 | Carnahan et al. |
| 6,088,760 A | 7/2000 | Walker et al. |
| 6,100,109 A | 8/2000 | Melzner et al. |
| 6,104,633 A | 8/2000 | Abraham et al. |
| 6,105,381 A | 8/2000 | Ghoshal |
| 6,108,725 A | 8/2000 | Chatter |
| 6,128,214 A | 10/2000 | Kuekes et al. |
| 6,136,160 A | 10/2000 | Hrkut et al. |
| 6,138,219 A | 10/2000 | Soman et al. |
| 6,144,481 A | 11/2000 | Kowarz et al. |
| 6,146,227 A | 11/2000 | Mancevski |
| 6,156,256 A | 12/2000 | Kennel |
| 6,159,620 A | 12/2000 | Heath et al. |
| 6,159,742 A | 12/2000 | Lieber et al. |
| 6,165,890 A | 12/2000 | Kohl et al. |
| 6,166,948 A | 12/2000 | Parkin et al. |
| 6,177,703 B1 | 1/2001 | Cunningham |

| | | | | | | |
|---|---|---|---|---|---|---|
| 6,183,714 | B1 | 2/2001 | Smalley et al. | 6,611,033 | B2 | 8/2003 | Hsu et al. |
| 6,187,823 | B1 | 2/2001 | Haddon et al. | 6,625,047 | B2 | 9/2003 | Coleman, Jr. |
| 6,190,634 | B1 | 2/2001 | Lieber et al. | 6,630,772 | B1 | 10/2003 | Bower et al. |
| 6,198,655 | B1 | 3/2001 | Heath et al. | 6,642,639 | B2 | 11/2003 | Choi et al. |
| 6,203,814 | B1 | 3/2001 | Fisher et al. | 6,643,165 | B2 | 11/2003 | Segal et al. |
| 6,203,864 | B1 | 3/2001 | Zhang et al. | 6,645,628 | B2 | 11/2003 | Shiffler, Jr. et al. |
| 6,212,597 | B1 | 4/2001 | Conlin et al. | 6,658,634 | B1 | 12/2003 | Goodnow et al. |
| 6,219,212 | B1 | 4/2001 | Gill et al. | 6,673,424 | B1 | 1/2004 | Lindsay et al. |
| 6,221,330 | B1 | 4/2001 | Moy et al. | 6,705,152 | B2 | 3/2004 | Routkevitch et al. |
| 6,226,722 | B1 | 5/2001 | Shippy et al. | 6,706,402 | B2 | 3/2004 | Rueckes et al. |
| 6,231,744 | B1 | 5/2001 | Ying et al. | 6,707,098 | B2 | 3/2004 | Hofmann et al. |
| 6,231,980 | B1 | 5/2001 | Cohen et al. | 6,709,566 | B2 | 3/2004 | Cumings et al. |
| 6,232,706 | B1 | 5/2001 | Dai et al. | 6,743,408 | B2 | 6/2004 | Lieber et al. |
| 6,233,665 | B1 | 5/2001 | Bolyn | 6,750,471 | B2 | 6/2004 | Bethune et al. |
| 6,237,130 | B1 | 5/2001 | Soman et al. | 6,759,693 | B2 | 7/2004 | Vögeli et al. |
| 6,239,547 | B1 | 5/2001 | Uemura et al. | 6,774,052 | B2 | 8/2004 | Vögeli et al. |
| 6,250,984 | B1 | 6/2001 | Jin et al. | 6,781,166 | B2 | 8/2004 | Lieber et al. |
| 6,256,767 | B1 | 7/2001 | Kuekes et al. | 6,784,028 | B2 | 8/2004 | Rueckes et al. |
| 6,259,277 | B1 | 7/2001 | Tour et al. | 6,803,840 | B2 | 10/2004 | Hunt et al. |
| 6,262,469 | B1 | 7/2001 | Le et al. | 6,808,746 | B1 | 10/2004 | Dai et al. |
| 6,265,333 | B1 | 7/2001 | Dzenis et al. | 6,809,462 | B2 | 10/2004 | Pelrine et al. |
| 6,277,318 | B1 | 8/2001 | Bower | 6,809,465 | B2 | 10/2004 | Jin |
| 6,300,205 | B1 | 10/2001 | Fulford et al. | 6,833,558 | B2 | 12/2004 | Lee et al. |
| 6,314,019 | B1 | 11/2001 | Kuekes et al. | 6,835,591 | B2 | 12/2004 | Rueckes et al. |
| 6,320,428 | B1 | 11/2001 | Atsumi et al. | 6,858,197 | B1 | 2/2005 | Delzeit |
| 6,322,713 | B1 | 11/2001 | Choi et al. | 6,863,942 | B2 | 3/2005 | Ren et al. |
| 6,325,909 | B1 | 12/2001 | Li et al. | 6,896,864 | B2 | 5/2005 | Clarke |
| 6,331,209 | B1 | 12/2001 | Jang et al. | 6,911,682 | B2 | 6/2005 | Rueckes et al. |
| 6,333,016 | B1 | 12/2001 | Resasco et al. | 6,919,284 | B2 | 7/2005 | Yamamoto et al. |
| 6,340,822 | B1 | 1/2002 | Brown et al. | 6,919,529 | B2 | 7/2005 | Franzen et al. |
| 6,342,276 | B1 | 1/2002 | You et al. | 6,919,740 | B2 | 7/2005 | Snider |
| 6,346,413 | B1 | 2/2002 | Fodor et al. | 6,921,575 | B2 | 7/2005 | Horiuchi et al. |
| 6,348,295 | B1 | 2/2002 | Griffith et al. | 6,924,538 | B2 | 8/2005 | Jaiprakash et al. |
| 6,348,700 | B1 | 2/2002 | Ellenbogen et al. | 6,946,410 | B2 | 9/2005 | French et al. |
| 6,350,488 | B1 | 2/2002 | Lee et al. | 6,955,937 | B1 | 10/2005 | Burke et al. |
| 6,354,133 | B1 | 3/2002 | Yedur et al. | 6,969,651 | B1 | 11/2005 | Lu et al. |
| 6,358,756 | B1 | 3/2002 | Sandhu et al. | 7,015,500 | B2 | 3/2006 | Choi et al. |
| 6,361,861 | B2 | 3/2002 | Gao et al. | 7,048,999 | B2 | 5/2006 | Smalley et al. |
| 6,362,073 | B2 | 3/2002 | Kim | 2001/0004979 | A1 | 6/2001 | Han et al. |
| 6,376,787 | B1 | 4/2002 | Martin et al. | 2001/0023123 | A1 | 9/2001 | Kim |
| 6,380,434 | B1 | 4/2002 | Chiang | 2001/0023986 | A1 | 9/2001 | Mancevski |
| 6,394,158 | B1 | 5/2002 | Momeni et al. | 2002/0055010 | A1 | 5/2002 | Gao et al. |
| 6,400,088 | B1 | 6/2002 | Livingston et al. | 2002/0061441 | A1 | 5/2002 | Ogura et al. |
| 6,400,091 | B1 | 6/2002 | Deguchi et al. | 2002/0068170 | A1 | 6/2002 | Smalley et al. |
| 6,406,776 | B1 | 6/2002 | D'Evelyn | 2002/0081380 | A1 | 6/2002 | Dillon et al. |
| 6,407,443 | B2 | 6/2002 | Chen et al. | 2002/0081787 | A1 | 6/2002 | Kohl et al. |
| 6,409,567 | B1 | 6/2002 | Amey et al. | 2002/0088938 | A1 | 7/2002 | Colbert et al. |
| 6,413,487 | B1 | 7/2002 | Resasco et al. | 2002/0090331 | A1 | 7/2002 | Smalley et al. |
| 6,417,606 | B1 | 7/2002 | Nakamoto et al. | 2002/0092983 | A1 | 7/2002 | Colbert et al. |
| 6,420,726 | B2 | 7/2002 | Choi et al. | 2002/0092984 | A1 | 7/2002 | Colbert et al. |
| 6,421,271 | B1 | 7/2002 | Gogl et al. | 2002/0096634 | A1 | 7/2002 | Colbert et al. |
| 6,422,450 | B1 | 7/2002 | Zhou et al. | 2002/0098135 | A1 | 7/2002 | Smalley et al. |
| 6,423,583 | B1 | 7/2002 | Avouris et al. | 2002/0102193 | A1 | 8/2002 | Smalley et al. |
| 6,426,134 | B1 | 7/2002 | Lavin et al. | 2002/0102194 | A1 | 8/2002 | Smalley et al. |
| 6,426,687 | B1 | 7/2002 | Osborn | 2002/0102196 | A1 | 8/2002 | Smalley et al. |
| 6,432,740 | B1 | 8/2002 | Chen | 2002/0102353 | A1 | 8/2002 | Mauthner et al. |
| 6,440,761 | B1 | 8/2002 | Choi et al. | 2002/0112814 | A1 | 8/2002 | Hafner et al. |
| 6,443,901 | B1 | 9/2002 | Fraser | 2002/0125805 | A1 | 9/2002 | Hsu |
| 6,445,006 | B1 | 9/2002 | Brandes et al. | 2002/0130311 | A1 | 9/2002 | Lieber et al. |
| 6,473,351 | B2 * | 10/2002 | Tomanek et al. ........... 365/215 | 2002/0130353 | A1 | 9/2002 | Lieber et al. |
| 6,495,116 | B1 | 12/2002 | Herman | 2002/0136896 | A1 | 9/2002 | Takikawa et al. |
| 6,495,258 | B1 | 12/2002 | Chen et al. | 2002/0160111 | A1 | 10/2002 | Sun et al. |
| 6,515,339 | B2 | 2/2003 | Shin et al. | 2002/0172639 | A1 | 11/2002 | Horiuchi |
| 6,518,156 | B1 | 2/2003 | Chen et al. | 2002/0172963 | A1 | 11/2002 | Kelley et al. |
| 6,533,620 | B2 | 3/2003 | Franzen et al. | 2002/0173083 | A1 | 11/2002 | Avouris et al. |
| 6,541,309 | B2 | 4/2003 | Chen | 2002/0175323 | A1 | 11/2002 | Guillom et al. |
| 6,548,841 | B2 | 4/2003 | Frazier et al. | 2002/0175390 | A1 | 11/2002 | Goldstein et al. |
| 6,559,468 | B1 | 5/2003 | Kuekes et al. | 2002/0179434 | A1 | 12/2002 | Dai et al. |
| 6,566,983 | B2 | 5/2003 | Shin | 2003/0004058 | A1 | 1/2003 | Li et al. |
| 8,566,983 | | 5/2003 | Shin et al. | 2003/0021141 | A1 | 1/2003 | Segal et al. |
| 6,574,130 | B2 | 6/2003 | Segal et al. | 2003/0021966 | A1 | 1/2003 | Segal et al. |
| 6,586,965 | B2 | 7/2003 | Kuekes | 2003/0022428 | A1 | 1/2003 | Segal et al. |
| 6,595,405 | B2 | 7/2003 | Terunuma et al. | 2003/0042834 | A1 | 3/2003 | Dean et al. |

| | | | | | | |
|---|---|---|---|---|---|---|
| 2003/0091825 A1 | 5/2003 | Shiffler et al. | | 2005/0280436 A1 | 12/2005 | Bertin |
| 2003/0108480 A1 | 6/2003 | Baker et al. | | 2005/0281084 A1 | 12/2005 | Rueckes et al. |
| 2003/0118727 A1 | 6/2003 | Ting et al. | | 2005/0282515 A1 | 12/2005 | Bertin |
| 2003/0122111 A1 | 7/2003 | Glatkowski | | 2005/0282516 A1 | 12/2005 | Bertin |
| 2003/0124325 A1 | 7/2003 | Rueckes et al. | | 2006/0044035 A1 | 3/2006 | Bertin |
| 2003/0124837 A1 | 7/2003 | Rueckes et al. | | 2006/0052509 A1 | 3/2006 | Saitoh |
| 2003/0132823 A1 | 7/2003 | Hyman et al. | | 2006/0061389 A1 | 3/2006 | Bertin |
| 2003/0165074 A1 | 9/2003 | Segal et al. | | 2006/0125033 A1 | 6/2006 | Segal et al. |
| 2003/0177450 A1 | 9/2003 | Nugent | | 2006/0128049 A1 | 6/2006 | Jaiprakash et al. |
| 2003/0180472 A1 | 9/2003 | Zhou et al. | | 2006/0183278 A1 | 8/2006 | Bertin et al. |
| 2003/0198812 A1 | 10/2003 | Rueckes et al. | | 2006/0193093 A1 | 8/2006 | Bertin et al. |
| 2003/0199172 A1 | 10/2003 | Rueckes et al. | | 2006/0204427 A1 | 9/2006 | Ghenciu et al. |
| 2003/0200521 A1 | 10/2003 | DeHon et al. | | 2006/0231865 A1 | 10/2006 | Rueckes et al. |
| 2003/0206436 A1 | 11/2003 | Eaton et al. | | 2006/0237805 A1 | 10/2006 | Segal et al. |
| 2003/0234407 A1 | 12/2003 | Vogeli et al. | | 2006/0237857 A1 | 10/2006 | Bertin et al. |
| 2003/0236000 A1 | 12/2003 | Vogeli et al. | | 2006/0250843 A1 | 11/2006 | Bertin et al. |
| 2004/0007528 A1 | 1/2004 | Bakajin et al. | | 2006/0250856 A1 | 11/2006 | Bertin et al. |
| 2004/0023514 A1 | 2/2004 | Moriya et al. | | 2006/0255834 A1 | 11/2006 | Bertin |
| 2004/0071949 A1 | 4/2004 | Glatkowski et al. | | 2006/0276056 A1 | 12/2006 | Ward et al. |
| 2004/0075159 A1 | 4/2004 | Vogeli | | 2007/0015303 A1 | 1/2007 | Bertin et al. |
| 2004/0077107 A1 | 4/2004 | Vogeli | | | | |
| 2004/0085805 A1 | 5/2004 | Segal et al. | | FOREIGN PATENT DOCUMENTS | | |
| 2004/0087162 A1 | 5/2004 | Vogeli | | DE | 19504967 | 8/1996 |
| 2004/0099438 A1 | 5/2004 | Arthur et al. | | DE | 19644121 | 5/1997 |
| 2004/0159833 A1 | 8/2004 | Rueckes et al. | | DE | 19929179 | 1/2001 |
| 2004/0164289 A1 | 8/2004 | Rueckes et al. | | EP | 0 217 023 A2 | 4/1987 |
| 2004/0175856 A1 | 9/2004 | Jaiprakash et al. | | EP | 0 296 716 A3 | 5/1988 |
| 2004/0181630 A1 | 9/2004 | Jaiprakash et al. | | EP | 0 269 225 A2 | 6/1988 |
| 2004/0191978 A1 | 9/2004 | Rueckes et al. | | EP | 0 269 225 A3 | 6/1988 |
| 2004/0214366 A1 | 10/2004 | Segal et al. | | EP | 0269255 | 6/1988 |
| 2004/0214367 A1 | 10/2004 | Segal et al. | | EP | 441 409 A3 | 7/1988 |
| 2004/0238907 A1 | 12/2004 | Pinkerton et al. | | EP | 441 409 B1 | 7/1988 |
| 2004/0253167 A1 | 12/2004 | Silva et al. | | EP | 0 296 716 A2 | 12/1988 |
| 2004/0265550 A1 | 12/2004 | Glatkowski et al. | | EP | 0 315 392 A2 | 5/1989 |
| 2005/0007002 A1 | 1/2005 | Golovchenko et al. | | EP | 0 315 392 A3 | 5/1989 |
| 2005/0035344 A1 | 2/2005 | Bertin et al. | | EP | 426 282 B1 | 8/1990 |
| 2005/0035367 A1 | 2/2005 | Bertin et al. | | EP | 0262282 | 5/1991 |
| 2005/0035786 A1 | 2/2005 | Bertin et al. | | EP | 0426282 | 5/1991 |
| 2005/0035787 A1 | 2/2005 | Bertin et al. | | EP | 0 613 130 A1 | 8/1994 |
| 2005/0036365 A1 | 2/2005 | Bertin et al. | | EP | 0613130 | 8/1994 |
| 2005/0037547 A1 | 2/2005 | Bertin et al. | | EP | 0 665 187 A1 | 8/1995 |
| 2005/0040874 A1 | 2/2005 | Allison et al. | | EP | 0 688 618 A2 | 12/1995 |
| 2005/0041465 A1 | 2/2005 | Rueckes et al. | | EP | 0 688 618 A3 | 12/1995 |
| 2005/0041466 A1 | 2/2005 | Rueckes et al. | | EP | 758 028 A3 | 7/1996 |
| 2005/0047244 A1 | 3/2005 | Rueckes et al. | | EP | 1 209 123 A2 | 9/1996 |
| 2005/0052894 A1 | 3/2005 | Segal et al. | | EP | 0 665 187 B1 | 12/1997 |
| 2005/0053525 A1 | 3/2005 | Segal et al. | | EP | 0 947 466 A1 | 10/1999 |
| 2005/0056825 A1 | 3/2005 | Bertin et al. | | EP | 0 989 579 A3 | 3/2000 |
| 2005/0056866 A1 | 3/2005 | Bertin et al. | | EP | 0 945 402 A1 | 9/2000 |
| 2005/0056877 A1 | 3/2005 | Rueckes et al. | | EP | 1 046 613 A2 | 10/2000 |
| 2005/0058590 A1 | 3/2005 | Sen et al. | | EP | 1 225 613 A1 | 10/2000 |
| 2005/0058797 A1 | 3/2005 | Sen et al. | | EP | 1 052 520 A1 | 11/2000 |
| 2005/0058834 A1 | 3/2005 | Rueckes et al. | | EP | 1 054 249 A1 | 11/2000 |
| 2005/0059176 A1 | 3/2005 | Rueckes et al. | | EP | 1 059 266 A3 | 12/2000 |
| 2005/0059210 A1 | 3/2005 | Rueckes et al. | | EP | 1 061 040 A1 | 12/2000 |
| 2005/0062035 A1 | 3/2005 | Bertin et al. | | EP | 1 061 043 A1 | 12/2000 |
| 2005/0062062 A1 | 3/2005 | Bertin et al. | | EP | 1 061 044 A1 | 12/2000 |
| 2005/0062070 A1 | 3/2005 | Bertin et al. | | EP | 1 061 544 A1 | 12/2000 |
| 2005/0063210 A1 | 3/2005 | Segal et al. | | EP | 1 061 555 A1 | 12/2000 |
| 2005/0063244 A1 | 3/2005 | Bertin et al. | | EP | 1 069 206 A2 | 1/2001 |
| 2005/0065741 A1 | 3/2005 | Segal et al. | | EP | 1 072 693 A1 | 1/2001 |
| 2005/0068128 A1 | 3/2005 | Yip | | EP | 1 132 920 A2 | 2/2001 |
| 2005/0074926 A1 | 4/2005 | Bertin et al. | | EP | 1 096 533 | 5/2001 |
| 2005/0095938 A1 | 5/2005 | Rosenberger et al. | | EP | 1 100 106 A2 | 5/2001 |
| 2005/0101112 A1 | 5/2005 | Rueckes et al. | | EP | 1 100 297 A2 | 5/2001 |
| 2005/0128788 A1 | 6/2005 | Segal et al. | | EP | 1100297 | 5/2001 |
| 2005/0174842 A1 | 8/2005 | Bertin et al. | | EP | 1 205 436 A1 | 11/2001 |
| 2005/0191495 A1 | 9/2005 | Rueckes et al. | | EP | 1186370 | 3/2002 |
| 2005/0237781 A1 | 10/2005 | Bertin et al. | | GB | 2 364 933 A | 7/2001 |
| 2005/0269553 A1 | 12/2005 | Sen et al. | | GB | 2364933 | 2/2002 |
| 2005/0270824 A1 | 12/2005 | Sen et al. | | JP | 1146426 | 6/1989 |
| 2005/0270824 A1 | 12/2005 | Bertin et al. | | JP | 11-011917 | 1/1999 |
| 2005/0279988 A1 | 12/2005 | Bertin | | | | |

| | | |
|---|---|---|
| JP | 2001-035362 | 2/2001 |
| JP | 2004-090208 | 3/2004 |
| WO | WO95/02709 A2 | 1/1995 |
| WO | WO95/02709 A3 | 1/1995 |
| WO | WO96/38410 | 12/1996 |
| WO | WO96/41043 | 12/1996 |
| WO | WO97/09272 | 3/1997 |
| WO | WO97/22971 | 6/1997 |
| WO | WO97/31139 | 8/1997 |
| WO | WO97/43473 | 11/1997 |
| WO | WO98/26871 | 6/1998 |
| WO | WO98/39250 | 9/1998 |
| WO | WO98/39251 | 9/1998 |
| WO | WO98/42620 | 10/1998 |
| WO | WO-98/44593 | 10/1998 |
| WO | WO98/48456 | 10/1998 |
| WO | WO99/06618 | 2/1999 |
| WO | WO 00/09443 | 7/1999 |
| WO | WO 00/08650 | 8/1999 |
| WO | WO99/47570 | 9/1999 |
| WO | WO99/48810 | 9/1999 |
| WO | WO99/58748 | 11/1999 |
| WO | WO99/65821 | 12/1999 |
| WO | WO 00/09443 | 2/2000 |
| WO | WO 00/17101 | 3/2000 |
| WO | WO 00/19494 | 4/2000 |
| WO | WO 00/63115 | 4/2000 |
| WO | WO 00/73204 A1 | 5/2000 |
| WO | WO 00/44094 | 7/2000 |
| WO | WO 00/48195 A1 | 8/2000 |
| WO | WO 01/18246 | 8/2000 |
| WO | WO 01/23303 | 8/2000 |
| WO | WO 00/63115 | 10/2000 |
| WO | WO 01/03208 A1 | 1/2001 |
| WO | WO 02/37500 | 5/2001 |
| WO | WO 01/44796 | 6/2001 |
| WO | WO 02/19420 | 8/2001 |
| WO | WO 02/38496 | 11/2001 |
| WO | WO 02/42204 | 11/2001 |
| WO | WO 02/054505 | 12/2001 |
| WO | WO 02/059898 | 1/2002 |
| WO | WO 02/060812 | 1/2002 |
| WO | WO 02/060813 | 1/2002 |
| WO | WO 02/48701 | 6/2002 |
| WO | WO 02/48822 | 6/2002 |
| WO | WO 03/091486 | 11/2003 |
| WO | WO 04/039893 | 5/2004 |
| WO | WO 04/065655 | 8/2004 |
| WO | WO 04/065657 | 8/2004 |
| WO | WO 04/065671 | 8/2004 |

OTHER PUBLICATIONS

"Double Sided 4Mb SRAM Coupled Cap PBGA Card Assembly Guide." International Business Machines Corp. (IBM), 1998.
Tyagi et al. "A 130nm Generation Logic Technology Featuring 70nm Transistors, Dual Vt Transistors and 6 Layers of Cu Interconnects." Portland Technology Development.
"Preliminary: 8Mb (256K×36 & 512K×18) and 4Mb (128K×36 & 256K×18) [IBM0418A8CBLBB, IBM0418A4CBLBB, IBM0436A8CBLBB, IBM0436A4CBLBB]." International Business Machines Corp. (IBM), 1998.
Wei, Chengyu et al. "Temperature and Stain-Rate Dependent Plastic Deformation of Carbon Nanotube."
"Package Mechanicals for USAR ICs." USAR Systems, Inc., 1998.
Dipert, Brian. "Exotic Memories, Diverse Approaches." EDN Magazine. Apr. 26, 2001, 56-70.
Duan, Xiangfeng. "Indium Phosphide Nanowires as Building Blocks for Nanoscale Electronic and Optoelectronic Devices." Nature (2001); 409: 66-69.
Yang. "A High Performance 180 nm Generation Logic Technology." Portland Technology Development.
Dai, Hongjie. "Controlled Chemical Routes to Nanotube Architectures, Physics, and Devices." The Journal of Physical Chemistry B (1999); 103: 11246-11255.
Callaby, D. Roy et al. "Solid State Memory Study Final Report." National Media Lab, Feb. 1994.
Cui, Yi. "Doping and Electrical Transport in Silicon Nanowires." The Journal of Physical Chemistry B (2000); vol. 104, No. 22: 5213-5216.
Li, Mingtao et al. "Direct Three-dimensional Patterning Using Nanoimprint Lithography." Applied Physics Letters (2000); vol. 78, No. 21: 3322-3324.
"8 Mb Synchronous Communication SRAM (IBM0418A86LQKA, IBM0418A86SQKA, IBM0436A861QKA, IBM436A86SQKA)." International Business Machines Corp. (IBM), 1999.
Dipert, Brian. "Memory Cards: Designing with a Full Deck." EDN Magazine. May 25, 2000.
Schönenberger, Christian et al. "Physics of Multiwall Carbon Nanotubes." Physics World. Apr. 4, 2000.
Whatmore, Roger W. "Nanotechnology." Ingenia. Feb. 2000.
"Nanochip NC800SX, 0.8 Gbyte Molecular Memory IC (R/W), Nanochip NC200SX, 0.2 Gbyte Molecular Memory IC (R/W), Nanochip NCM4510SX, Molecular Array Read/write Engine, Low Voltage Thermal Actuated, Dynamic Media Series M2, Nanochip NC4525DX, A/D-D/A Interface, Preliminary Specifications, Advance Information, (C) 1996-2000 Nanochip Document NCM2230500."
Odom, Teri Wang et al. "Atomic Structure and Electronic Properties of Single-Walled Carbon Nanotubes." Nature (1998); 391: 62-64.
Ouyang, Min. "Atomically Resolved Single-Walled Carbon Nanotube Intramolecular Junctions." Science (2001); 291: 97-100.
Odom, Teri Wang et al. "Magnetic Clusters on Single-Walled Carbon Nanotubes: The Kondo Effect in a One-Dimensional Host." Science (2000); 290: 1549-1552.
Wong, Eric et al. "Nanobeam Mechanics: Elasticity, Strength, and Toughness of Nanorods and Nanotubes." Science (1997); 277: 1971-1975.
Hu, Jiangtao et al. "Controlled Growth and Electrical Properties of Heterojunctions of Carbon Nanotubes and Silicon Nanowires." Nature (1999); 399: 48-51.
Rueckes, Thomas et al. "Carbon Nanotube-Based Nonvolatile Random Access Memory for Molecular Computing." Science (2000); 289: 94-7.
Kim, Philip et al. "Nanotube Nanotweezers." Science (1999); 286: 2148-2150.
Huang, Yu et al. "Directed Assembly of One-Dimensional Nanostructures into Functional Networks." Science (2001); 291: 630-33.
Cui, Yi et al. "Functional Nanoscale Electronic Devices Assembled Using Silicon Nanowire Building Blocks." Science (2001); 291: 851-53.
Oullette, Jennifer. "Exploiting Molecular Self-Assembly." The Industrial Physicist. American Institute of Physics, Dec. 2000.
Peng, Shu et al. "Chemical Control of Nanotube Electronics." Nanotechnology (2000); 11: 57-60.
"The Ultimate Memory Guide." Kingston Technology (1998).
Morales, Alfredo et al. "A Laser Ablation Method for the Synthesis of Crystalline Semiconductor Nanowires." Science (1998); 279: 208-11.
Franklin, Nathan R. and Hongjie Dai, "An Enhanced CVD Approach to Extensive Nanotube Networks with Directionality." Advanced Materials (2000): 890-894.
Kong, Jing; Chongwu Zhou; Erhan Yenilmez; Hongjie Dai. "Alkaline metal-doped n-type semiconducting nanotubes as quantum dots." ApplieDPhysics Letters (Dec. 11, 2000): 3977-3979.
Tombler, Thomas W.; Chongwu Zhou; Jing Kong; Hongjie Dai. "Gating individual nanotubes and crossed with scanning probes." Applied Physics Letters (Apr. 24, 2000): 2412-2414.
Zhou, Chongwu: et al. "Electrical measurements of individual semiconducting single-walled carbon nanotubes of various diameters." Applied Physics Letters (Mar. 20, 2000): 1597-1599.
Zhang, Y. and Hongjie Dai. "Formation of metal nanowires on suspended single-walled carbon nanotubes." Applied Physics Letters (Nov. 6, 2000): 3015-3017.

Chen, Robert J. et al. "Molecular photodesorption from single-walled carbon nanotubes." *Applied Physics Letters* (Oct. 1, 2001): 2258-2260.

Zhang, Y. et al. "Electric-field-directed growth of aligned single-walled carbon nanotubes." *Applied Physics Letters* (Nov. 5, 2001): 3155-3157.

Zhang, Y. et al. "Metal coating on suspended carbon nanotubes and its implication to metal-tube interaction." *Chemical Physics Letters* (Nov. 24, 2000): 35-41.

Chen, Robert J. et al. "Noncovalent Sidewall Functionalization of Single-Walled Carbon Nanotubes for Protein Immobilization." *American Chemical Society* (2001): 3838-3839.

Li, Yiming et al. "Growth of Single-Walled Carbon Nanotubes from Discrete Catalytic Nanoparticles of Various Sizes." *American Chemical Society* (2001).

Cassell, Alan M. et al. "Large Scale CVD Synthesis of Single-Walled Carbon Nanotubes." *American Chemical Society* (1999): 6484-6492.

Fan, Shoushan et al. "Carbon nanotube arrays on silicon substrates and their possible application." *Physica E* (2000): 179-183.

Liu, Lei et al. "Controllable Reversibility of an sp2 to sp3 Transition of a single Wall Nanotube under the Manipulation of an AFM Tip." *Physical Review Letters* (May 22, 2000): 4950-4953.

Kong, Jing et al. "Quantum Interference and Ballistic Transmission in Nanotube Electron Waveguides." *Physical Review Letters* (Sep. 3, 2001); 87, 106801(4).

Liu, C. et al. "Synthesis of Macroscopically Long Ropes of Well-Aligned Single-Walled Carbon Nanotubes." *Advanced Materials* (Aug. 16, 2000); 12, 1190-1192.

Kiang, Ching-Hwa. "Growth of Large-Diameter Single-Walled Carbon Nanotubes." *American Chemical Society* (2000); 104, 2454-2456.

Cheung. Chin Li et al. "Growth and fabrication with single-walled carbon nanotube probe microscopy tips." *Applied Physics Letters* (2000); 76, 3136-3138.

Bozovic, Dolores et al. "Electronic properties of mechanically induced kinds on single-walled carbon nanotubes." *Applied Physics Letters* (Jun. 4, 2001); 78, 3693-3695.

Hafner, Jason H. et al. "High-Yield Assembly of Individual Single-Walled Carbon Nanotube Tips for Scanning Prone Microscopies." *The Journal of Physical Chemistry* (Feb. 1, 2001); 105, 743-746.

Hafner, J.H. et al. "Structural and functional imaging with carbon nanotube AFM probes." *Progress in Biophysics & Molecular Biology* (2001); 77, 73-110.

Jorio, A. et al. "Joint density of electronic states for one isolated single-wall carbon nanotube studied by resonant Raman scattering." *Physical Review B* (2001); 63: 24541(4).

Filho, A. G. Souza et al. "Electronic transition energy Eii for an isolated (n, m) single-wall carbon nanotube obtained by anti-Stokes/Stokes resonant Raman intensity ratio." *Physical Review* (2002); 63, 241404(4).

Saito, R. et al. "Chirality-dependent G-band Raman intensity of carbon nanotubes." *Physical Review* (2001); 64, 085312(7).

Jorio, A. et al. "Structural (n, m) Determination of Isolated Single-Wall Carbon Nanotubes by Resonant Raman Scattering." *Physical Review Letters* (Feb. 5, 2001); 86, 1118-1121.

Woolley, Adam T. et al. "Structural biology with carbon nanotube AFM probes." *Chemistry & Biology* (2000); 7, R193-204.

Li, Yan et al. "Preparation of Monodispersed Fe-Mo Nanoparticles as the Catalyst for CVD Synthesis of Carbon Nanotubes." *Chemical Material* (2001): 13; 1008-1014.

Rao, C. N. R. et al. "Nanotubes." *CHEMPHYCHEM* (2001); 2, 78-105.

Nerushev, Oleg A. et al. "Carbon nanotube films obtained by thermal chemical vapor deposition." *Journal of Chemistry Materials* (2001); 11, 1122-1132.

Flahaut, E. et al. "Synthesis of single-walled carbon nanotube-Co-MgO composite powders and extraction of the nanotubes." *Journal of Chemical Materials* (2000); 10, 249-252.

Dresselhaus, Mildred S. and Phaedon Avouris. "Introduction to Carbon Materials Research." *Topics Applied Physics* (2001); 80, 1-9.

Dresselhaus, Mildred S. and Morinobu Endo. "Relation of Carbon Nanotubes to Other Carbon Materials." *Topics in Applied Physics* (2001); 80, 11-28.

Dai, Hongjie. "Nanotube Growth and Characterization." *Topics in Applied Physics* (2001); 80, 29-53.

Charlier, Jean-Chrisophe and Sumio Iijima. "Growth Mechanisms of Carbon Nanotubes." *Topics in Applied Physics* (2001); 80, 55-81.

Tenne, Richard and Alex K. Zettl. "Nanotubes from Inorganic Materials." *Topics in Applied Physics* (2001); 80, 81-112.

Louie, Steven G. "Electronic Properties, Junctions, and Defects of Carbon Nanotubes." *Topics in Applied Physics* (2001); 80, 113-145.

Yao, Zhen et al. "Electrical Transport Through Single-Wall Carbon Nanotubes." *Topics in Applied Physics* (2001); 80, 147-171.

Odom, Teri Wang et al. "Scanning Probe Microscopy Studies of Carbon Nanotubes." *Topics in Applied Physics* ((2001); 80, 173-211.

Saito, Riichiro and Hiromichi Kataura. "Optical Properties and Raman Spectroscopy of Carbon Nanotubes." *Topics in Applied Physics* (2001); 80, 213-247.

Fink, Joerg H. and Philippe Lambin. "Electron Spectroscopy Studies of Carbon Nanotubes." *Topics in Applied Physics* (2001); 80, 247-272.

Hone, James. "Phonons and Thermal Properties of Carbon Nanotubes." *Topics in Applied Physics* (2001); 80, 273-286.

Yakobson, Boris I. and Phaedon Avouris. "Mechanical Properties of Carbon Nanotubes." *Topics in Applied Physics* (2001); 80, 287-327.

Forro, Laszlo and Christian Schoenenberger. "Physical Properties of Multi-wall Nanotubes." *Topics in Applied Physics* (2001); 80, 329-391.

Ajayan, Pulickel M. and Otto Z. Zhou. "Applications of Carbon Nanotubes." *Topics in Applied Physics* (2001); 80, 391-425.

Kong, J. et al. "Synthesis, integration, and electrical properties of individual single-walled carbon nanotubes." *Applied Physics A* (1999); 69, 305-308.

Dai, Hongjie et al. "Exploiting the properties of carbon nanotubes for nanolithography." *Applied Physics Letters* (Sep. 14, 1998); 73, 1508-1510.

Soh, Hyongsok T. et al. "Integrated nanotube circuits." *Applied Physics Letters* (Aug. 2, 1999); 75, 627-629.

Bozler, C.O., et al., "Fabrication and Microwave Performance of the Permeable Base Transistor," *IEEE Tech. Dig. Int. Electron Devices Meeting* (1979) 384.

Cheng, H. M. et al. "Large-scale and low-cost synthesis of single-walled carbon nanotubes by the catalytic pyrolysis of hydrocarbons." *Applied Physics Letters* (Jun. 22, 1998); 72, 3282-3284.

Shim, Moonsub et al. "Polymer Functionalization for Air-Stable n-Type Carbon Nanotube Field-Effect Transistors." *Journal of American Chemical Society* (2001); 123, 11512-11513.

Haddon, R. C. "C70 Thin Film Transistors." *Journal of the American Chemical Society* (1996); 118, 3041-3042.

Hafner, Jason H. et al. "Direct Growth of Single-Walled Carbon Nanotube Scanning Probe Microscopy Tips." *Journal of the American Chemical Society* (1999); 121, 9750-9751.

Hafner, Jason H. et al. "Growth of nanotubes for probe microscopy tips." *Scientific Correspondence* (Apr. 29, 1999); 398, 761, 762.

Bekyarova, E. et al. "Oxidation and Porosity Evaluation of Budlike Single-Wall Carbon Nanohorn Aggregates." *American Chemical Society* (2002).

Hafner, Jason H. et al. "Catalytic growth of single-wall carbon nanotubes from metal particles." *Chemical Physics Letters* (Oct. 30, 1998); 296, 195-202.

Kiang, Ching-Hwa. "Growth of Large-Diameter Single-Walled Carbon Nanotubes." *Journal of Physical Chemistry A.* (2000); 104, 2454-2456.

Nerushev, Oleg A. et al., "Carbon nanotube films obtained by thermal chemical vapour deposition." *Journal of Material Chemistry* (2001); 11, 1122-1132.

Zhou, Chongwu et al. "Electrical measurements of individual semiconducting single-walled carbon nanotubes of various diameters." *Applied Physics Letters* (Mar. 20, 2000); 76, 1597-1599.

Yu, et al., *J. Phys. Chem. B*, 105:6831-6837 (2001).

Berber, S., *Phys. Rev. Lett*, 84, 4613 (2000).

Bahr, Jeffrey L. and James. M. Tour. "Highly Functionalized Carbon Nanotubes Using in Situ Generated Diazonium Compounds." *Chemical Materials* (2001); 13, 3823-3824.

Peigney, Alain et al. "A Study of the Formation of Single- and Double- Walled Carbon Nanotubes by a CVD Method." *Journal of Physical Chemistry B* (2001); 105, 9699-9710.

Yao, B. D. and N. Wang. "Carbon Nanotube Arrays Prepared by MWCVD." *Journal of Physical Chemistry* (2001); 105, 11395-11398.

Ago, Hiroki et al. "Gas-Phase Synthesis of Single-wall Carbon Nanotubes from Colloidal Solution of Metal Nanoparticles." *Journal of Physical Chemistry B* (Nov. 1, 2001); 105, 10453-10456.

Li, Yiming et al. "Growth of Single-Walled Carbon Nanotubes from Discrete Catalytic Nanoparticles of Various Sizes." *Journal of Physical Chemistry B* (2001); 105, 11424-11431.

Ng, Hou Tee et al. "Soft-Lithography-Mediated Chemical Vapor Deposition of Architectured Carbon Nanotube Networks on Elastomeric Polymer." *American Chemical Society* (2001).

Derycke, V. et al. "Carbon Nanotube Inter-and Intramolecular Logic Gates." *Nano Letters* (Sep. 2001); 1, 453-456.

Erkoc et al., *Int. J. Modern Phys. C*, 12:865-870 (2001).

Benerjee, Sarbajit and Stanislaus S. Wong. "Functionalization of Carbon Nanotubes with a Metal-Containing Molecular Complex." *Nano Letters* (2001); 0, A-E.

Reynoso, J. 391PGA Drawings (3): Project No. 32639103. *Kyocera America, Inc.* (Apr. 12, 1994).

Diehl, Michael R. et al. "Self-Assembled, Deterministic Carbon Nanotube Wiring Networks." *Angew. Chemical International Edition* (2002); 41, 353-356.

Table of Contents for Semiconductor Consulting Services (1999).

Sidorov, S. N. et al. "Cobalt Nanoparticle Formation in the Pores of Hyper-Cross-Linked Polystyrene," *Chemical Materials* (1999); 11, 3210-3215.

Brown, David A. et al. "Kinetics of Inron(III) Chelation from Polynuclear Oxo-Hydroxy Aggregates by Hydroxamic Acids." *Inorganic Chemistry* (1999); 38, 5198-5202.

Douglas, Trevor and Vistoria T. Stark. "Nanophase Cobalt Oxyhydroxide Mineral Synthesized within the Protein Cage of Ferritin." *Inorganic Chemistry* (2000); 39, 1828-1830.

Hatzikonstantinidou et al., *Phys. Scripta* 54: 226-229 (1994).

Cao, Anyuan et al. "Macroscopic Three-Dimensional Arrays of Fe Nanoparticles Supported in Aligned Carbon Nanotubes." *The Journal of Physical Chemistry B* (2001); 105, 11937-11940.

Li, Shoutian et al. "Semiconductor Nanoparticles in Contact: Quenching of the Photoluminescence from Silicon Nanocrystals by WO3 nanoparticles Suspended in Solution." *The Journal of Physical Chemistry B* (1998); 102, 7319-7322.

Zhang, Shengjun et al. "Select Pathways to Caron Nanotube Film Growth." *Advanced Materials* (Dec. 3, 2001); 13, 1767-1770.

Wei, B. Q. et al. "Organized assembly of carbon nanotubes." *Nature* (Apr. 4, 2002); 416, 495-496.

Zhao, Y.-P. et al. "Frequency-dependent electrical transport in carbon nanotubes." *Physical Review B* (2001); 64, 201402(4).

Zhu, H. W. et al. "Direct Synthesis of Long Single-Walled Carbon Nanotube Strands." *Science* (May 3, 2002); 296, 884-886.

Ajayan, P. M. et al. "Nanotubes in a Flash—Ignition and Reconstruction." *Science* (Apr. 26, 2002); 296, 705.

Franklin, Nathan R. et al. "Patterned growth of single-walled carbon nanotubes of full 4-inch wafers." *Applied Physics Letters* (Dec. 31, 2001); 79, 4571-4573.

Fan, Shoushan et al. "Self-Oriented Regular Arrays of Carbon Nanotubes and Their Field Emission Properties." *Science* (Jan. 22, 1999); 283, 512 -514.

Sohn, Jung Inn, et al., "Patterned selective growth of carbon nanotubes and large field emission from vertically well-aligned carbon nanotube field emitter arrays." *Appl. Phys. Letters* (Feb. 12, 2001); 78, 901-903.

Postma, Henk W. C. et al. "Manipulation and Imaging of Individual Single-Walled Carbon Nanotubes with an Atomic Force Microscope." *Advanced Materials* (Sep. 1, 2000); 12, 1299-1302.

Chen, J. et al., "Large On-Off Ratios and Negative Differential Resistance in a Molecular Electronic Device," *Science*, vol. 286, Nov. 19, 1999, pp. 1550-151.

Collier, C.P., et al., "Electronically Configurable Molecular-Based Logic Gates," *Science*, vol. 285, Jul. 16, 1999, pp. 391-394.

"IBM Builds Tiny Transistor that Beats Silicon", *Technology — Reuters*, Yahoo, May 16, 2002.

Yao, Z., et al, *Phys. Rev. Lett*, 84, 2941 (2000).

Tans, Sander J., "Room-temperature transistor based on a single carbon nanotube," Nature, May 1998, vol. 393, pp. 49-52.

Dillon, Anne C., "A Simple and Complete Purification of Single-Walled Carbon Nanotube Materials," Advanced Materials, 1999, vol. 11, pp. 1354-1358.

Cleland, A.N., "Single-crystal aluminum nitride nanomechanical resonators," Applied Physics Letters, Sep. 24, 2001, vol. 79, pp. 2070-2072.

Calleja, M., "Fabrication of Gold Nanowires on Insulating Substrates by Field-Induced Mass Transport," Applied Physics Letters, Oct. 8, 2001, vol. 79, pp. 2471-2473.

Kluth, P., "Fabrication of epitaxial $CoSi_2$ nanowires," Applied Physics Letters, Aug. 6, 2001, vol. 79, pp. 824-826.

Zhang, Y., "Formation of metal nanowires on suspended single-walled carbon nanotubes," Applied Physics Letters, Nov. 6, 2000, vol. 77, pp. 3015-3017.

Berry, A.D., "Fabrication of GaAs and InAs wires in nanochannel gas," Applied Physics Letters, Nov. 4, 1996, vol. 69, pp. 2846-2848.

Li, Jian-Long, "Spontaneous formation of ordered indium nanowire array on Si(001)," Applied Physics Letters, Oct. 22, 2001, vol. 79, pp. 2826-2828.

Jorritsma, J., "Fabrication of large arrays of metallic nanowires on V-grooved substrates," Applied Physics Letters, Sep. 4, 1995, vol. 67, pp. 1489-1491.

Sekiba, Daiichiro, "Fabrication of stable nanopatterns on metals," Applied Physics Letters, Sep. 30, 2002, vol. 81, pp. 2632-2634.

Yin, A. J., "Fabrication of highly ordered metallic nanowire arrays by electrodeposition," Applied Physics Letters, Aug. 31, 2001, vol. 79, pp. 1039-1041.

He, J. Z., "Dispersion, refinement, and manipulation of single silicon nanowires," Applied Physics Letters, Mar. 11, 2002, vol. 80, pp. 1812-1814.

Franklin, Nathan R., "Integration of suspended carbon nanotube arrays into electronic devices and electromechanical systems," Applied Physics Letters, Jul. 29, 2002, vol. 81, pp. 913-915.

Homma, Yoshikazu, "Growth of suspended carbon nanotube networks on 100-nm-scale silicon pillars," Applied Physics Letters, Sep. 16, 2002, vol. 81, pp. 2261-2263.

Yenilmez, Erhan, "Wafer scale production of carbon nanotube scanning probe tips for atomic force microscopy," Applied Physics Letters, Mar. 25, 2002, vol. 80, pp. 2225-2227.

Sax, Herald, "Polysilicon Overfill Etch Back Using Wet Chemical Spin-Process Technology," 7 pages.

Dinaro, Joanna, "Analysis of an Elementary Reaction Mechanism for Benzene Oxidation in Supercritical Water, Combustion Institute," 2000, vol. 28, pp. 1529-1536.

Monthioux, M., "Sensitivity of single-wall carbon nanotubes to chemical processing: an electron microscopy investigation," Carbon, 2001, vol. 39, pp. 1251-1272.

Hou, P. X., "Multi-step purification of carbon nanotubes," 2002 Elsevier Science Ltd., Mar. 8, 2001, vol. 40, pp. 81-85.

Avouris, P., "Carbon nanotube electronics," Carbon, 2002, vol. 40, pp. 429-445.

Chen, Bin, "Heterogeneous Single-Walled Carbon Nanotube Catalyst Discovery and Optimization," Chemical Materials, Dec. 7, 2001, vol. 14, pp. 1891-1896.

Maurin, I., "Carbon Miscibility in the Boron Layers of the $MgB_2$ Superconductor," Chemical Materials, 2002, pp. A-D.

Hyeon-Lee, Jingyu, "Aero-Sol-Gel Synthesis of Nanostructured Silica Powders," Chemical Materials, 1997, vol. 9, pp. 2400-2403.

McEuen, Paul L., Single-Walled Carbon Nanotube Electronics, to be published in the inaugural issue of the IEEE Transactions on Nanotechnology (2002), 9 pgs.

Dürkop, T., "Nanotubes are High Mobility Semiconductors," Department of Physics, University of Maryland, 4 pgs.

Choi, Hee Cheul, "Spontaneous Reduction of Metal Ions on the Sidewalls of Carbon Nanotubes," J. Amer. Chem. Soc., May 7, 2002, pp. A-B.

Zheng, Bo, "Efficient CVD Growth of Single-Walled Carbon Nanotubes on Surfaces Using Carbon Monoxide Precursor,"Nano Letters, 2002, pp. A-D.

Deng, S. Z., "Synthesis of silicon carbide nanowires in a catalyst-assisted process," Chemical Physics Letters, Apr. 26, 2002, vol. 356, pp. 511-514.

Zhang, R. Q., "Silicon nanotubes: Why not?," Chemical Physics Letters, 2002, vol. 364, pp. 251-258.

Lei, Y., "Fabrication, characterization and Raman study of $TiO_2$ nanowire arrays prepared by anodic oxidative hydrolysis of $TiCl_3$," Chemical Physics Letters, 2001, vol. 338, pp. 231-236.

Zheng, M. J., "Fabrication and optical properties of large-scale uniform zinc oxide nanowire arrays by one-step electrochemical deposition technique," Chemical Physics Letters, 2002, vol. 363, pp. 123-128.

O'Connell, Michael J., "Reversible water-solubilization of single-walled carbon nanotubes by polymer wrapping," Chemical Physics Letters, 2001, vol. 342, pp. 265-271.

Huang, Houjin, "Purification and alignment of arc-synthesis single-walled carbon nanotube bundles," Chemical Physics Letter, 2002, vol. 356, pp. 567-572.

Kong, Jing, "Chemical vapor deposition of methane for single-walled carbon nanotubes," Chemical Physics Letters, 1998, vol. 292, pp. 567-574.

Bergbreiter, David E., "Using Soluble Polymers To Recover Catalysts and Ligands," Chemical Reviews, Mar. 5, 2002, pp. A-AM.

Roucoux, Alain, "Reduced Transition Metal Colloids: A Novel Family of Reusable Catalysts?," Chemical Reviews, Jan. 30, 2002, pp. A-V.

Yoshida, Jun-ichi, "Tag Strategy for Separation and Recovery," Chemical Reviews, Mar. 18, 2002, pp. A-X.

De Vos, Dirk E., "Ordered Mesoporous and Microporous Molecular Sieves Functionalized with Transition Metal Complexes as Catalysts for Selective Organic Transformations," Chemical Reviews, Jan. 31, 2002, pp. A-Z.

Connelly, Neil G., "Chemical Redox Agents for Organometallic Chemistry," Chemical Reviews, Jan. 9, 1996, vol. 96, pp. 877-910.

Dequesnes, Marc, "Calculation of pull-in voltages for carbon-nanotube-based nanoelectromechanical switches," Nanotechnology, Jan. 22, 2002, vol. 13, pp. 120-131.

Serp, Philippe, "Chemical Vapor Deposition Methods for the Controlled Preparation of Supported Catalytic Materials," Chemical Reviews, Apr. 10, 2002, pp. A-AR.

Wind, S.J., "Localized and Directed Lateral Growth of Carbon Nanotubes from a Porous Template," IBM T.J. Watson Research Center, 17 pgs.

Wind, S. J., "Fabrication and Electrical Characterization of Top Gate Single-Wall Carbon Nanotube Field-Effect Transistors," IBM T. J. Watson Research Center, 14 pgs.

Harutyunyan, Avetik R., "CVD Synthesis of Single Wall Carbon Nanotubes under "Soft" Conditions," Nano Letters, Feb. 25, 2002, pp. A-F.

Massot, L., "Electrodeposition of carbon films from molten alkaline fluoride media," Electrochimica Acta, Jan. 28, 2002, vol. 47, pp. 1949-1957.

Heinze, S., "Carbon Nanotubes as Schottky Barrier Transistors," Physical Review Letters, Sep. 2, 2002, vol. 89, pp. 106801-1 through 106801-4.

Duan, Xiangfeng, "Indium phosphide nanowires as building blocks for nanoscale electronic and optoelectronic devices," Nature, Jan. 4, 2001, vol. 409, pp. 66-69.

Chen, Robert J., "Noncovalent Sidewall Functionalization of Single-Walled Carbon Nanotubes for Protein Immobilization," J. Amer. Chem. Soc., 2001, vol. 123, pp. 3838-3839.

Puntes, Victor F., "Synthesis of hcp-Co Nanodisks," J. Amer. Chem. Soc., 2002, vol. 124, pp. 12874-12880.

An, Lei, "Synthesis of Nearly Uniform Single-Walled Carbon Nanotubes Using Identical Metal-Containing Molecular Nanoclusters as Catalysts," j. Amer. Chem. Soc., 2002, total of 4 pgs.

Cassell, Alan M., "Directed Growth of Free-Standing Single-Walled Carbon Nanotubes," American Chemical Society, Jun. 21, 1999, vol. 121, pp. 7975-7976.

Bahr, Jeffrey L., "Functionalization of Carbon Nanotubes by Electrochemical Reduction of Aryl Diazonium Salts: A Bucky Paper Electrode," American Chemical Society, 2001, vol. 123, pp. 6536-6542.

Fruchart, O., "Vertical self-organization of epitaxial magnetic nanostructures," Journal of Magnetism and Magnetic Materials, 2002, vol. 239, pp. 224-227.

Zhang, J., "Fabrication and photoluminescence of ordered GaN nanowire arrays," Journal of Chemical Physics, Oct. 1, 2001, vol. 115, pp. 5714-5717.

Dubois, S., "Fabrication and properties of arrays of superconducting nanowires," Journal of Materials Research Mar. 1999, vol. 14, pp. 665-671.

Liu, Z.Q., "Synthesis of $\alpha$-$SiO_2$ nanowires using Au nanoparticle catalysts of a silicon substrate," Journal of Materials Research, Mar. 2001, vol. 16, pp. 683-686.

Lei, Y, Fabrication, characterization, and photoluminescence properties of highly ordered $TiO_2$ nanowire arrays, J. Material Research, Apr. 2001, vol. 16, pp. 1138-1144.

Li, Y., "Fabrication of Highly ordered ZnO nanowire arrays in anodic alumina membranes," J. Materials Research, Nov. 2000, vol. 15, p. 2305-2308.

Sellmyer, D.J., "Magnetism of Fe, Co and Ni nanowires in self-assembled arrays," J. of Physics: Condensed Matter, (2000) vol. 13, pp. R433-R460.

Blick, R.H., "Nanostructural silicon for studying fundamental aspects of nanomechanics," J. of Physics: Condensed Matter, (2002), pp. R905-R945.

Ciraci, S., "Quantum effects in electrical and thermal transport through nanowires," J. of Physics: Condensed Matter, (2001), pp. R537-R568.

Yu, Jae-Young, "Silicon Nanowires: Preparation, Device, Fabrication, and Transport Properteis," J. Phys. Chem. B 2000, vol. 104, pp. 11864-11870.

Yu, Zhonghua, "(n, m) Structural Assignments and Chirality Dependence in Single-Wall Carbon Nanotube Raman Scattering," J. Phys. Chem. B 2001, vol. 105, pp. 6831-6837.

Wang, Y.W., "Fabrication of Ordered Ferromagnetic-Nonmagnetic Alloy Nanowire Arrays and their Magnetic Property Dependence on Annealing Temperature," J. Phys. Chem. B 2002, vol. 106, pp. 2502-2507.

Murphy, Robert, "High-Yield, Nondestructive Purification and Quantification Method for Multiwalled Carbon Nanotubes," J. Phys. Chem. B 2002, vol. 106, pp. 3087-3091.

Li, C.P., "Silicon Nanowires Wrapped with Au Film," J. Phys. Chem. B 2002, vol. 106, pp. 6980-6984.

Steuerman, David W., "Interactions between Conjugated Polymers and Single-Walled Carbon Nanotubes," J. Phys. Chem. B. 2002, vol. 106, pp. 3124-3130.

Li, Jun, "Novel Three-Dimensional Electrodes: Electrochemical Properties of Carbon Nanotube Ensembles," J. Phys. Chem. B 2002, pp. A-G.

Cassell, Alan M., "Large Scale CVD Synthesis of Single-Walled Carbor Nanotubes," J. Phys. Chem. B 1999, vol. 103, pp. 6484-6492.

Dai, Hongju, "Controlled Chemical Routes to Nanotube Architectures, Physics, and Devices," J. Phys. Chem. B 1999, vol. 103, pp. 11246-11255.

Chiang, I.W., "Purification and Characterization of Single-Wall Carbon Nanotubes (SWNTs) Obtained from the Gas-Phase Decomposition of CO (HiPco Process)," J. Phys. Chem. B 2001, vol. 105, pp. 8297-8301.

Tulchinsky, D.A., "Fabrication and domain imaging of iron magnetic nanowire arrays," J. Vac. Sci. Technol., May/Jun. 1998, A 16(3), pp. 1817-1819.

Yun, Wan Soo, "Fabrication of metal nanowire using carbon nanotube as a mask," J. Vac. Sci. Technol., Jul./Aug. 2000, A 18(4), pp. 1329-1332.

Batra, Inder P., "Quantum transport through one-dimensional aluminum wires," J. Vac. Sci. Technol., May/Jun. 2002, B 20(3), pp. 812-817.

Tsutsumi, Toshiyuki, "Fabrication technology of ultrafine $SiO_2$ masks and Si nanowires using oxidation of vertical sidewalls of a poly-Si layer," J. Vac. Sci. Technol., Jan./Feb. 1999, B 17(1), pp. 77-81.
Namatsu, Hideo, "Fabrication of one-dimensional nanowire structures utilizing crystallographic orientation in silicon and their conductance characteristics," J. Vac. Sci. Technol., Sep./Oct. 1997, B 15(5), pp. 1688-1696.
Namatsu, Hideo, "Fabrication of thickness-controlled silicon nanowires and their characteristics," J. Vac. Sci. Technol., Nov./Dec. 1995, B 13(6), pp. 2166-2169.
Cassell, Alan M., "Combinatorial Optimization of Heterogeneous Catalysts Used in the Growth of Carbon Nanotubes," Langmuir 2001, vol. 17, pp. 260-264.
Lewenstein, Justin C. High-Yield Selective Placement of Carbon Nanotubes on Pre-Patterned Electrodes, Nano Letters., 2002, vol. 2, No. 5, pp. 443-446.
Martino, Anthony, "Catalyst Testing of Highly Dispersed Metal Nanoparticles for Coal Liquefaction and Coal/Waste Copressing," Catalysis and Chemical Technologies Department, Sandia National Laboratories, pp. 1-7.
Peng, X.S., "Electrochemical fabrication of ordered $Ag_2S$ nanowire arrays," Materials Research Bulletin, 2002, No. 37, pp. 1369-1375.
Robinson, L.A. W., "Self-aligned electrodes for suspended carbon nanotube structures," Microelectronics Research Centre, Cavendish Laboratory, University of Cambridge and Hitachi Cambridge Laboratory, pp. 1-2.
Moore, Gordon E., "Cramming more components into integrated circuits," Electronics, Apr. 19, 1965, vol. 38, No. 8(4), 4 pgs.
Fan, Hongyou, "Multiphased assembly of nanoporous silica particles," Journal of Non-Crystalline Solids (2001) vol. 285, pp. 71-78.
Franklin, Nathan R., "Integration of suspended carbon nanotube arrays into electronic devices and electromechanical systems," Applied Physics Letters, Jul. 29, 2002, vol. 81, No. 5, 913-915.
Kong, Jing, "Synthesis of individual single-walled carbon nanotubes on patterned silicon wafers," Nature, Oct. 29, 1998, vol. 395, pp. 878-881.
Duan, Xiangfeng, "Nonvolatile Memory and Programmable Logic from Molecule-Gated Nanowires," Nano Letters, 2002, pp. A-D.
Fuhrer, M.S., "High-Mobility Nanotube Transistor Memory," Nano Letters, 2002, vol. 2, No. 7, pp. 755-759.
Radosavljević, M., "Nonvolatile Molecular Memory Elements Based on Ambipolar Nanotube Field Effect Transitors," Nano Letters, 2002, vol. 2, pp. 761-764.
Derycke, V., "Catalyst-Free Growth of Ordered Single-Walled Carbon Nanotube Networks," Nano Letters, 2002, pp. A-D.
Joselevich, Ernesto, "Vectorial Growth of Metallic and Semiconducting Single-Wall Carbon Nanotubes," Nano Letters, xxxx, vol. 0, pp. A-E.
Javey, Ali, "Carbon Nanotube Transistor Arrays for Multistage Complementary Logic and Ring Oscillators," Nano Letters, 2002, pp. A-D.
Robertson, John, "Section 11. Non-Crystalline Carbon, Properties and Prospects for Non-Crystalline Carbons," Journal of Non-Crystalline Solids 299-302, 2002, pp. 798-804.
Ci, Lijie, "Double Wall Carbon Nanotubes Promoted by Sulfur in a Floating Iron Catalyst CVD System," Chemical Physics Letters 359, Jun. 13, 2002, pp. 63-67.
Gromov, A., "Purification of Carbon Nanotubes," Caramel Workshop, Jan. 23, 2002, pp. 1-13.
Cui, Yi, "Functional Nanoscale Electronic Devices Assembled Using Silicon Nanowire Building Blocks," Science, Feb. 2, 2001, vol. 291, pp. 851-853.
Wang, Suhua, Thermal Oxidation of $Cu_2S$ Nanowires: a Template Method for the Fabrication of Mesoscopic $Cu_xO$ ($x$=1,2) Wires, Phys. Chem. Chem. Phys., 2002, vol. 4, pp. 3425-3429.
Untiedt, C., "Fabrication and Characterization of Metallic Nanowires," Physical Review B, Jul. 15, 1997, vol. 56, No. 4, pp. 2154-2160.
Marsen, Bjorn, "Fullerene-Structured Nanowires of Silicon," Physical Review B, Oct. 15, 1999, vol. 60, No. 16, pp. 11593-11600.
Berber, Savas, "Unusually High Thermal Conductivity of Carbon Nanotubes," Physical Review Letters, May 15, 2000, vol. 84, No. 20, pp. 4613-4616.
Yao, Zhen, "High-Field Electrical Transport in a Single-Wall Carbon Nanotubes," Physical Review Letters, Mar. 27, 2000, vol. 84, No. 13, pp. 2641-2944.
Zhang, Y.F., "Liquid Phase Synethesis of Carbon Nanotubes," Physica B 323, 2002, pp. 293-295.
Dresselhaus, M.S., "Raman Spectroscopy on One Isolated Carbon Nanotube," Physica B 323, 2002, pp. 15-20.
Heinze, S., "Carbon Nanotubes as Schottky Barrier Transistors," Physical Review Letters, Sep. 2, 2002, vol. 89, No. 10, 106801-1-106801-4.
Fu, Qiang, "Electrodeposition of Carbon Films from Various Organic Liquids," Surface & Coatings Technology 124, 2000, pp. 196-200.
Hernadi, K., "Reactivity of Different Kinds of Carbon During Oxidative Purification of Catalytically Prepared Carbon Nanotubes,", Solid State Ionics 141-142, 2001, pp. 203-209.
Colomer, J. F., "Different Purification Methods of Carbon Nanotubes Produced by Catalytic Synthesis," Synthetic Metals 103, 1999, pp. 2482-2483.
Dalton, A.B., "A Functional Conjugated Polymer to Process, Purify and Selectively Interact with Single Wall Carbon Nanotubes," Synthetic Metals 121, 2001, pp. 1217-1218.
Tat, Kerk Wai, "Preparation and Characterization of Cobalt/Silica Core-Shell Magnetic Nanoparticles," Dept. Chem., National University of Singapore 2000/2001, pp. 1-5.
Shipley, Microposit® XP-90104A E-Beam Resist, Preliminary Product Information, pp. 1-2.
Smalley, R. E., Foreword (Publication unknown), Jan. 2001.
Dresselhaus, Mildred S., Preface (Publication unknown) Jan. 2001.
Advanced Semiconductor Engineering, Inc., Substrate Design 420L BGA 35*35, Dwg. No. K-I-0420, 2 pages.
Integrated Device Technology, Inc., DA Package Design, Sep. 25, 1997, 2 pages.
Pimenta, M.A., "Diameter dependence of the Raman D-band in isolated single-wall carbon nanotubes," Physical Review B, vol. 64 pgs. 04140-1-04140-4.
Duan, Xiangfeng, Nonvolatile Memory and Programmable Logic from Molecule-Gated Nanowires, Nano Letters, Mar. 2002, pp. 1-4.
Introduction and Historical Perspective, Chapter 1, pp. 1-48.
Modern CMOS Technology, Chapter 2, pp. 49-92.
Crystal Growth, Wafer Fabrication and Basic Properties of Silicon Wafers, Chapter 3, pp. 93-149.
Kong, J., et al., "Chemical Vapor Disposition of Methane for Single-Walled Carbon Nanotubes." Chemical Physics Letters, 292, 567, 1998.
Li., Y., et al., "Growth of Single-Walled Carbon Nanotubes from Discrete Catalytic Nanoparticles of Various Sizes." *The Journal of Physical Chemistry B* (2001); 105, 11424-11431.
Colomer, J.-F., at al., "Characterization of Single-Walled Carbon Nanotubes Produced by CCVD Method." *Chemical Physics Letters* (2001); 345, 11-17.
Li, Y. et al., "Preparation of Monodispersed Fe-Mo Nanoparticles as the Catalyst for CVD Synthesis of Carbon Nanotubes." Chem. Mater., 12. 1008, 2001.
Cassell, A., et al., "Directed Growth of Free-Standing Single-Walled Carbon Nanotubes." *Journal of the American Chemical Society* (1999); vol. 121, 7975-7976.
Delzeit, L., et al., "Multilayered Metal Catalysts for Controlling the Density of Single-walled Carbon Nanotube Growth." Chemical Physics Letters, 348, 368, 2001.
Wei, Y., et al., "Effect of Catalyst Film Thickness on Carbon Nanotube Growth by Selective Area Chemical Vapor Deposition." *Applied Physics Letters* (2001); vol. 78, pp. 1394-1396.
Su., M., et al., "A Scalable CVD Method for the Synthesis of Single-Walled Carbon Nanotubes with High Catalyst Productivity." *Chemical Physics Letters* (2000); vol. 322, 231-326.
Harutyunyan, A., et al., "CVD Synthesis of Single Wall Carbon Nanotubes under 'Soft' Conditions." *Nano Letters* vol. 2c No. 5 525 (2002); Published on web Mar. 27, 2002.

Li, Q., et al., "High-Density Growth of Single-Wall Carbon Nanotubes on Silicon by Fabrication of Nanosized Catalyst Thin Films." *Chem. Mater.* (2002), 14, 4262; Published on web Sep. 11, 2002.

Javey, A., et al., "Carbon Nanotube Transistor Arrays for Multistage Complementary Logic and Ring Oscillators." *Nano Letters* (2002); vol. 2 No. 9 929-932. Published on web Jul. 31, 2002.

Chen, B., et al., "Heterogeneous Single-Walled Carbon Nanotube Catalyst Discovery and Optimization." *Chem. Mater.* (2002); vol. 14 1891-1896.

Yenilmez, E., et al., "Wafer Scale Production of carbon Nanotube Scanning Probe Tips for Atomic Force Microscopy." *Applied Physics Letters.* (2002); vol. 80 No. 12, 2225-2227.

Collins, P., et al., "Engineering Carbon Nanotubes and Nanotube Circuits Using Electrical Breakdown." Science (2001); 292: 706-709.

Kim, W., et al., "Synthesis of Ultralong and High Percentage of Semiconduction Single-walled Carbon Nanotubes." *Nano Letters* (2002); vol. 2 No. 7 703-708. Published on web Jun. 1, 2002.

Liu, et al., "Organizing Single-Walled Carbon Nanotubes on Gold Using a Wet Chemical Self-Assembling Technique, Langmuir," Apr. 18, 2000, vol. 16, No. 8, 3659-3573.

Zheng et al, "Chemical Vapor Deposition Growth of Well-Aligned Carbon Nanotube Patterns on Cubic Mesoporous Silica Films by Soft Lithography", Chemistry of Materials, Jun. 9, 2001, vol. 13, 2240-2242.

Huang, et al., "Patterned Growth of Well-Aligned Carbon Nanotubes: A Soft-Lithographic Approach", The Journal of Physical Chemistry B., Mar. 16, 2000, vol. 104, No. 10, 2193-2196.

Chattopadhyay, et al., "Metal-Assisted Organization of Shortened Carbon Nanotubes in Monolayer and Mulilayer Forest Assemblies", Journal of the American Chemical Society, Aug. 28, 2001, vol. 123, 9451-9452.

Bonard, J. et al., "Monodisperse Multiwall Carbon Nanotubes Obtained with Ferritin as Catalyst", Nano Letters, 2002, vol. 2, No. 6, 665-667.

Collins, P., "Engineering Carbon Nanotubes and Nanotube Circuits Using Electrical Breakdown", Science, vol. 292, Apr. 27, 2001, pp. 706-709.

Homma, Y., "Single-Walled Carbon Nanotube Growth on Silicon Substrates Using Nanoparticle Catalysts", Jpn. J. Appl. Phys., vol. 41 (2002), pp. L89-L91.

Snow, E.S. et al., "Random Networks of Carbon Nanotubes as an Electronic Material." Applied Physics Letters, Mar. 31, 2003, vol. 82, No. 13, 2145-2147.

Bernholc et al., "Mechanical and Electrical Properties of Nanotubes", Annu. Rev. Mater. Res., 32 (2002) 347.

Ramsperger, U., "Fabrication and lateral electronic transport measurements of gold nanowires," Applied Physics Letters, Jan. 1, 2001, vol. 78, pp. 85-87.

Legrand, B., "Silicon nanowires with sub 10 nm lateral dimensions: From atomic force microscope lithography based fabrication to electrical measurements," J. Vac. Sci. Technol., May/Jun. 2002, B 20(3), pp. 862-870.

Ajayan, P.M., et al., "Nanometric-Size Tubes of Carbon", Rep. Prog. Phys. 60 (1997) 1025-1062.

Bernholc et al., Mechanical and electrical properties on nanotubes, Annu. Rev. Mater. Res., 32 (2002) 347-375.

Desai et al., "Freestanding Carbon Nanotube Specific Fabrication," Proc. of 2005 5th IEEE Conf., Nanotech., Nagoya, Japan, pp. 1-4, Jul. 2005.

Kaneto, K. et al., "Electrical conductivities of multi-wall carbon nanotubes", Synthetic Metals, Elsevier Science S.A. (1999), vol. 103, pp. 2543-2546.

Kinaret, J.M. et al., "A Carbon-nanotube-based nanorelay," *Applied Physics Letters*, Feb. 24, 2003, vol. 82, No. 8, pp. 1287-1289.

Martel, R., et al, "Carbon Nanotube Field-Effect Transistors and Logic Circuits," *DAC* 2002, Jun. 10-12, 2002, vol. 7.4, pp. 94-98.

Onoa, G.B. et al., "Bulk production of singly dispersed carbon nanotubes with prescribed lengths," *Nanotechnology*, vol. 16, pp. 2799-2803, 2005.

Snow, E.S., "Chemical Detection with a Single-Walled Carbon Nanotube Capacitor", Science, Mar. 25, 2005, vol. 307, pp. 1942-1945.

Snow, E.S., "Chemical Detection Using Single-Walled Carbon Nanotubes", Naval Research Laboratory, Washington, DC 202375, pp. 376-379.

Stadermann, M. et al., "Nanoscale study of conduction through carbon nanotube networks," *Phys. Rev. B* 69, 201402(R), 2004.

* cited by examiner

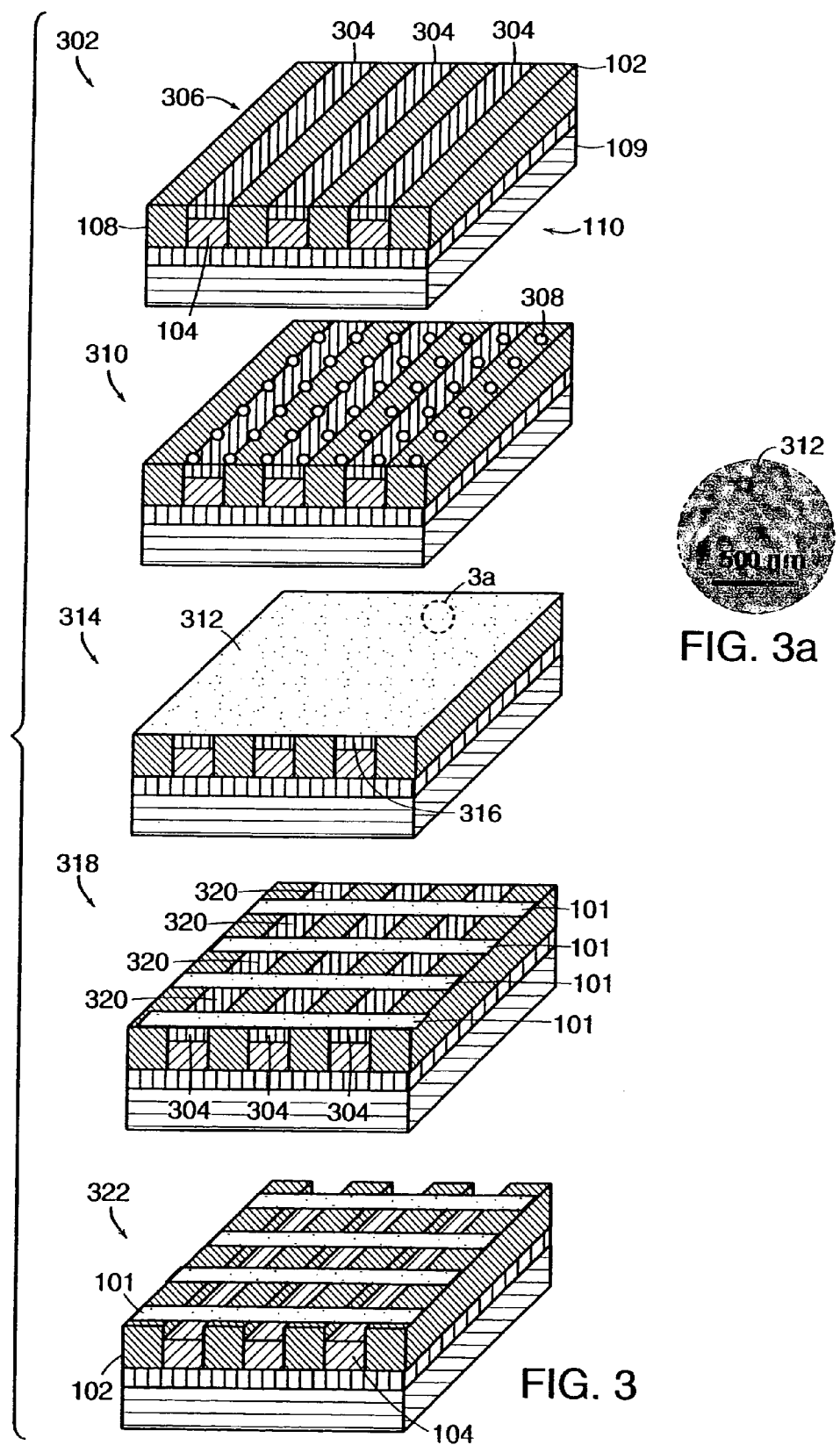

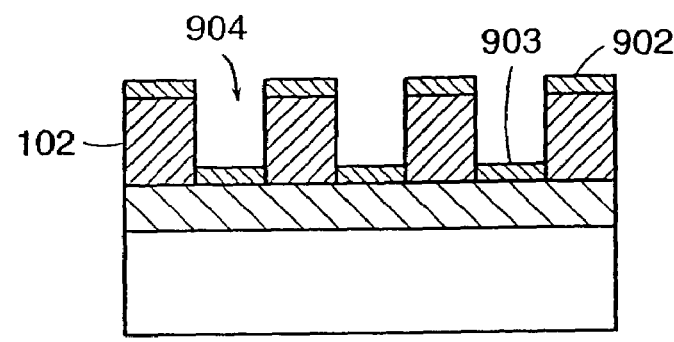
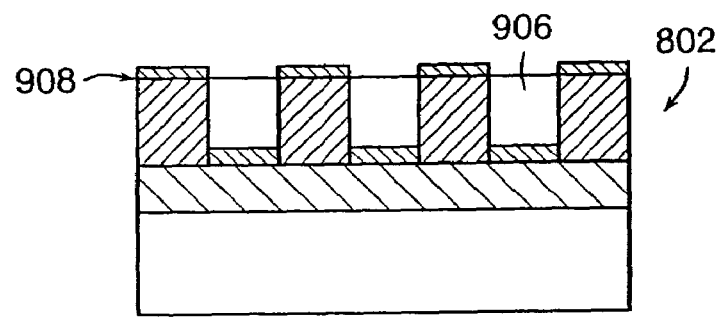
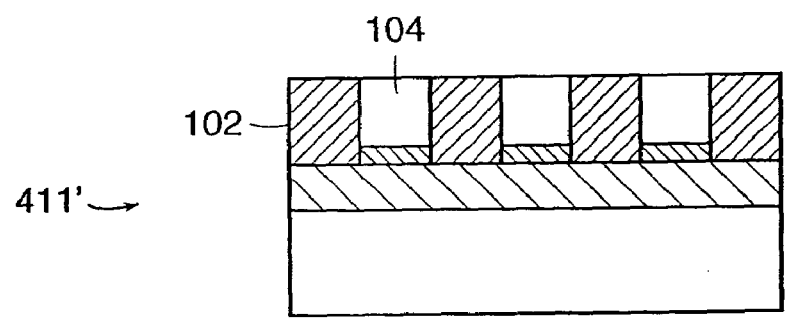
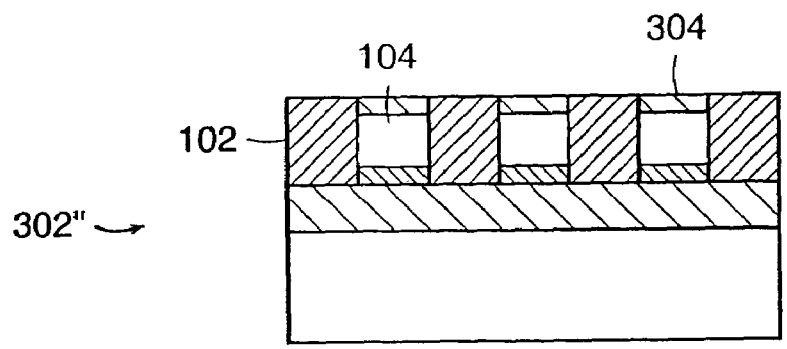
FIG. 9

HYBRID CIRCUIT HAVING NANOTUBE ELECTROMECHANICAL MEMORY

CROSS-REFERENCE TO RELATED APPLICATIONS

This application is a continuation of U.S. patent application Ser. No. 10/379,973, filed Mar. 5, 2003 now U.S. Pat. No. 6,836,424, which is a continuation of U.S. patent application Ser. No. 09/915,095, filed Jul. 25, 2001, now U.S. Pat. No. 6,574,130, both of which are assigned to the assignee of this application.

This application is related to the following applications, all of which are assigned to the assignee of this application, and all of which are incorporated by reference in their entirety:

Electromechanical Memory Array Using Nanotube Ribbons and Method for Making Same (U.S. patent application Ser. No. 09/915,093, filed Jul. 25, 2001); and, Electromechanical Memory Having Cell Selection Circuitry Constructed with Nanotube Technology (U.S. patent application Ser. No. 09/915,173 filed Jul. 25, 2001).

BACKGROUND

1. Technical Field

This invention relates in general to nonvolatile memory devices for use as memory storage in an electronic device and in particular to nonvolatile memory arrays that use electromechanical elements as the individual memory cells.

2. Discussion of Related Art

Important characteristics for a memory cell in electronic device are low cost, nonvolatility, high density, low power, and high speed. Conventional memory solutions include Read Only Memory (ROM), Programmable Read only Memory (PROM), Electrically Programmable Memory (EPROM), Electrically Erasable Programmable Read Only Memory (EEPROM), Dynamic Random Access Memory (DRAM) and Static Random Access Memory (SRAM).

ROM is relatively low cost but cannot be rewritten. PROM can be electrically programmed but with only a single write cycle. EPROM has read cycles that are fast relative to ROM and PROM read cycles, but has relatively long erase times and reliability only over a few iterative read/write cycles. EEPROM (or "Flash") is inexpensive, and has low power consumption but has long write cycles (ms) and low relative speed in comparison to DRAM or SRAM. Flash also has a finite number of read/write cycles leading to low long-term reliability. ROM, PROM, EPROM and EEPROM are all non-volatile, meaning that if power to the memory is interrupted the memory will retain the information stored in the memory cells.

DRAM stores charge on transistor gates that act as capacitors but must be electrically refreshed every few milliseconds complicating system design by requiring separate circuitry to "refresh" the memory contents before the capacitors discharge. SRAM does not need to be refreshed and is fast relative to DRAM, but has lower density and is more expensive relative to DRAM. Both SRAM and DRAM are volatile, meaning that if power to the memory is interrupted the memory will lose the information stored in the memory cells.

Consequently, existing technologies are either non-volatile but are not randomly accessible and have low density, high cost, and limited ability to allow multiples writes with high reliability of the circuit's function, or they are volatile and complicate system design or have low density. Some emerging technologies have attempted to address these shortcomings.

For example, magnetic RAM (MRAM) or ferromagnetic RAM (FRAM) utilizes the orientation of magnetization or a ferromagnetic region to generate a nonvolatile memory cell. MRAM utilizes a magnetoresistive memory element involving the anisotropic magnetoresistance or giant magnetoresistance of ferromagnetic materials yielding nonvolatility. Both of these types of memory cells have relatively high resistance and low-density. A different memory cell based upon magnetic tunnel junctions has also been examined but has not led to large-scale commercialized MRAM devices. FRAM uses a circuit architecture similar to DRAM but which uses a thin film ferroelectric capacitor. This capacitor is purported to retain its electrical polarization after an externally applied electric field is removed yielding a nonvolatile memory. FRAM suffers from a large memory cell size, and it is difficult to manufacture as a large-scale integrated component. See U.S. Pat. Nos. 4,853,893; 4,888, 630; 5,198,994

Another technology having non-volatile memory is phase change memory. This technology stores information via a structural phase change in thin-film alloys incorporating elements such as selenium or tellurium. These alloys are purported to remain stable in both crystalline and amorphous states allowing the formation of a bi-stable switch. While the nonvolatility condition is met, this technology appears to suffer from slow operations, difficulty of manufacture and reliability and has not reached a state of commercialization. See U.S. Pat. Nos. 3,448,302; 4,845,533; 4,876,667; 6,044, 008.

Wire crossbar memory (MWCM) has also been proposed. See U.S. Pat. Nos. 6,128,214; 6,159,620; 6,198,655. These memory proposals envision molecules as bi-stable switches. Two wires (either a metal or semiconducting type) have a layer of molecules or molecule compounds sandwiched in between. Chemical assembly and electrochemical oxidation or reduction are used to generate an "on" or "off" state. This form of memory requires highly specialized wire junctions and may not retain non-volatility owing to the inherent instability found in redox processes.

Recently, memory devices have been proposed which use nanoscopic wires, such as single-walled carbon nanotubes, to form crossbar junctions to serve as memory cells. See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94–97, 7 Jul., 2000. Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

The NTWCM proposals to date rely on directed growth or chemical self-assembly techniques to grow the individual nanotubes needed for the memory cells. These techniques are now believed to be difficult to employ at commercial scales using modern technology. Moreover, they may contain inherent limitations such as the length of the nanotubes that may be grown reliably using these techniques, and it may difficult to control the statistical variance of geometries of nanotube wires so grown.

SUMMARY

The invention provides a hybrid memory system having electromechanical memory cells. A memory cell core circuit has an array of electromechanical memory cells, in which each cell is a crossbar junction at least one element of which is a nanotube or a nanotube ribbon. An access circuit provides array addresses to the memory cell core circuit to select at least one corresponding cell. The access circuit is constructed of semiconductor circuit elements.

BRIEF DESCRIPTION OF THE DRAWING

In the Drawing,

FIG. 3 illustrates acts of making memory devices according to certain embodiments of the invention;

FIGS. 4–11 illustrate several forms of creating an intermediate structure used to make memory devices according to certain embodiments of the invention;

DETAILED DESCRIPTION

Preferred embodiments of the invention provide new electromechanical memory arrays and methods for making same. In particular, electromechanical memory cells are created that operate analogously to the NTWCM devices disclosed in WO 01/03208, which is hereby incorporated by reference in its entirety. However, unlike the NTWCM devices disclosed in WO 01/03208, preferred embodiments of the invention replace The suspended nanoscopic wires used in the NTWCM devices with new ribbons made from a matted layer of nanotubes or a non-woven fabric of nanotubes. These new devices are referred to herein as nanotube ribbon crossbar memories (NTRCMs). The new nanotube belt structures are believed to be easier to build at the desired levels of integration and scale (in number of devices made) and the geometries are more easily controlled.

Because the new nanotube belt crossbar memory devices operate analogously to NTWCM, the description of their architecture and principles of operation is brief. Reference may be made to WO 01/03208 for fuller description and background.

Figure 1:
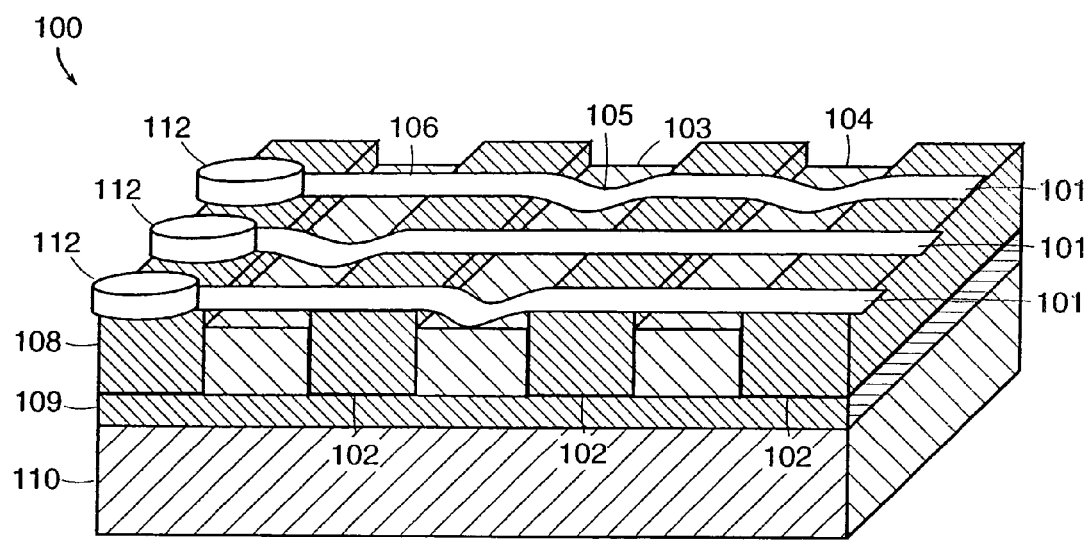
FIG. 1 illustrates a nanotube belt crossbar memory device according to certain embodiments of the invention.

FIG. 1 illustrates an exemplary electromechanical memory array 100 constructed according to principles of preferred embodiments of the invention.

The array has a plurality of non volatile memory cells 103 which can be in an "on" state 105 or "off" state 106. The actual number of such cells is immaterial to understanding the invention but the technology may support devices having information storage capacities equivalent to or larger than modern non-volatile circuit devices.

Each memory cell 103 includes a nanotube ribbon 101 suspended by one or more supports 102 over electrical traces or wires, e.g., 104.

Each crossing of a ribbon 101 and a wire, e.g., 104 forms a crossbar junction and defines a memory cell. Under certain embodiments, each cell may be read or written by applying currents and or voltages to electrodes 112 which are in electrical communication with ribbons 101 or through electrodes (not shown) in communication with traces or wires 104. The supports 102 are made from a layer 108 of silicon nitride ($Si_3N_4$). Below layer 108 is a gate oxide layer 109 separating the n-doped silicon traces 104 from an underlying silicon wafer 110.

Figure 2A:
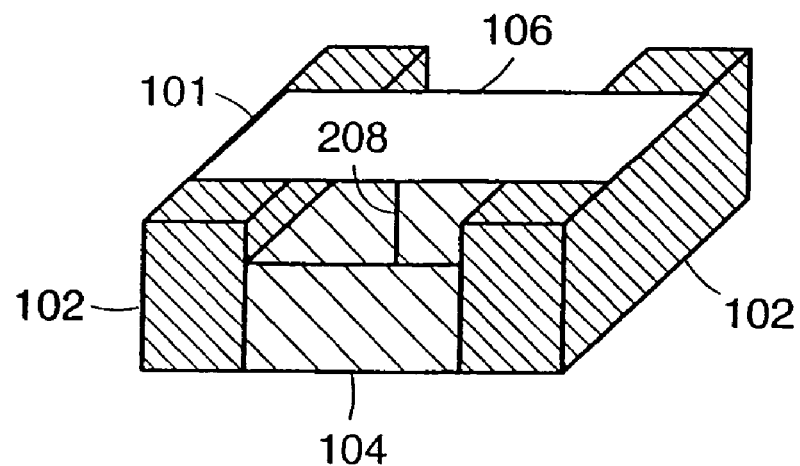
FIGS. 2A–B illustrate two states of a memory cell according to certain embodiments of the invention.
Figure 2B:
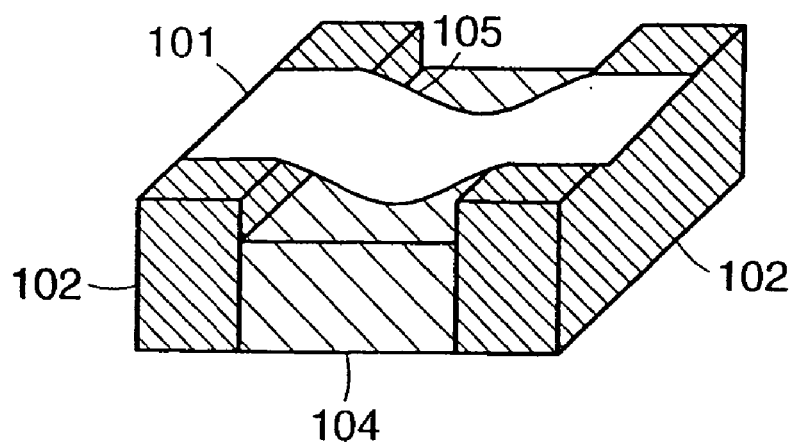

Referring conjointly to FIGS. 1–2B, junction 106 illustrates the cell in a first physical and electrical state in which the nanotube ribbon 101 is separated from corresponding trace 104. Junction 105 illustrates the cell in a second physical and electrical state in which the nanotube ribbon 101 is deflected toward corresponding trace 104. In the first state, the junction is an open circuit, which may be sensed as such on either the ribbon 101 or trace 104 when so addressed. In the second state, the junction is a rectified junction (e.g., Schottky or PN), which may be sensed as such on either the tube 101 or trace 104 when so addressed.

Under certain embodiments, the nanotube ribbon 101 may be held in position at the supports by friction. In other embodiments the ribbon may be held by other means, such as by anchoring the ribbons to the supports using any of a variety of techniques. This friction can be increased through the use of chemical interactions including covalent bonding through the use of carbon compounds such as pyrenes or other chemically reactive species. Evaporated or spin-coated material such as metals, semiconductors or insulators especially silicon, titanium, silicon oxide or polyimide could also be added to increase the pinning strength. The nanotube ribbons or individual nanotubes can also be pinned through the use wafer bonding to the surface. See R. J. Chen et al., "Noncovalent Sidewall Functionalization of Single-Walled Carbon Nanotubes for Protein Immobilization," J. Am. Chem. Soc., 123, 2001, 3838–39 and Dai et al., Appl. Phys. Lett., 77, 2000, 3015–17 for exemplary techniques for pinning and coating nanotubes by metals. See also WO01/03208 for techniques.

Under certain preferred embodiments as shown in FIGS. 2A–B, a nanotube ribbon 101 has a width of about 180 nm and is pinned to a support 102 preferably fabricated of silicon nitride. The local area of trace 104 under ribbon 101 forms an n-doped silicon electrode and is positioned close to the supports 102 and preferably is no wider than the belt, e.g., 180 nm. The relative separation 208 from the top of the support 102 to the deflected position where the belt 101 attaches to electrode 206 (see FIG. 2B) should be approximately 5–50 nm. The magnitude of the separation 208 is designed to be compatible with electromechanical switching capabilities of the memory device. For this embodiment, the 5–50 nm separation is preferred for certain embodiments utilizing ribbons 101 made from carbon nanotubes, but other separations may be preferable for other materials. This magnitude arises from the interplay between strain energy and adhesion energy of the deflected nanotubes. These feature sizes are suggested in view of modern manufacturing techniques. Other embodiments may be made with much smaller (or larger) sizes to reflect the manufacturing equipment's capabilities.

The nanotube ribbon 101 of certain embodiments is formed from a non-woven fabric of entangled or matted nanotubes (more below). The switching parameters of the ribbon resemble those of individual nanotubes. Thus, the predicted switching times and voltages of the ribbon should approximate the same times and voltages of nanotubes. Unlike the prior art which relies on directed growth or chemical self-assembly of individual nanotubes, preferred embodiments of the present invention utilize fabrication techniques involving thin films and lithography. This method of fabrication lends itself to generation over large surfaces especially wafers of at least six inches. (In contrast, growing individual nanotubes over a distance beyond sub millimeter distances is currently unfeasible.) The ribbons should exhibit improved fault tolerances over individual nanotubes, by providing redundancy of conduction pathways contained with the ribbons. (If an individual nanotube breaks other tubes within the rib provide conductive paths, whereas if a sole nanotube were used the cell would be faulty.) Moreover, the resistances of the ribbons should be significantly lower than that for an individual nanotubes, thus, decreasing its impedance, since the ribbons may be made to have larger cross-sectional areas than individual nanotubes.

FIG. 3 illustrates a method of making certain embodiments of NTRCM devices 100. A first intermediate structure 302 is created or provided. In the illustrated embodiment, the structure 302 includes a silicon substrate 110 having an insulating layer 109 (such as silicon dioxide) and a silicon nitride layer ($Si_3N_4$) 108 that defines a plurality of supports 102. In this instance, the supports 102 are formed by rows of patterned silicon nitride, though many other arrangements are possible, such as a plurality of columns. Conductive traces 104 extend between supports 102. In this instance, the traces 104 are shown as essentially contacting the supports 102, but other arrangements are possible as are other geometries; for example, spaces may exist between trace 104 and support 102 and trace 104 may be fashioned as a wire or may have non-rectangular transverse, cross-sections, including triangular or trapezoidal. Sacrificial layers 304 are disposed above the traces 104 so as to define one planar surface 306 with the upper surface of the supports 102. This planar surface, as will be explained below, facilitates growth of a matted nanotube layer of certain embodiments.

Once such a structure 302 is created or provided, the upper surface 306 receives a catalyst 308. For example, under certain embodiments, a catalyst metal 308, containing iron (Fe), molybdenum (Mo), cobalt or other metals, is applied by spin-coating or other application techniques to create a second intermediate structure 310.

A matted layer 312 of nanotubes is then grown into a non-woven fabric of single-walled carbon nanotubes (SWNTs) to form a third intermediate structure 314. For example, the second intermediate structure 310 may be placed into an oven and heated to a high temperature (for example, about 800–1200° C.) while gases containing a carbon source, hydrogen and inert gas, such as argon or nitrogen, are flowed over the upper surface. This environment facilitates the generation or growth of the matted layer or film 312 of single-walled carbon nanotubes. The layer 312 is primarily one nanotube thick and the various tubes adhere to one another via Van der Waals forces. Occasionally, one nanotube grows over the top of another, though this growth is relatively infrequent due to the growth tendencies of the material. Under some embodiments (not shown), the catalyst 308 may be patterned to assist in growing the nanotubes with specific densities either more or less dense as is desired. When conditions of catalyst composition and density, growth environment, and time are properly controlled, nanotubes can be made to evenly distribute over a given field that is primarily a monolayer of nanotubes. Proper growth requires control of parameters including but not limited to catalyst composition and concentration, functionalization of the underlying surface, spin coating parameters (length and RPM), growth time, temperature and gas concentrations.

A photoresist may then be applied to the layer 312 and patterned to define ribbons in the matted layer of nanotubes 312. The ribbon patterns cross (for example, perpendicularly) the underlying traces 104. The photoresist is removed to leave ribbons 101 of non-woven nanotube fabric lying on planar surface 306 to form fourth intermediate structure 318.

The fourth intermediate structure 318 has portions 320 of its underlying sacrificial layer 304 exposed as shown. The structure 318 is then treated with an acid, such as HF, to remove the sacrificial layer 304, including the portion under the ribbons 101, thus forming an array 322 of ribbons 101 suspended over traces 104 and supported by supports 102.

Subsequent metalization may be used to form addressing electrodes, e.g., 112 shown in FIG. 1.

One aspect of the above technique is that the various growth, patterning, and etching operations may use conventional techniques, such as lithographic patterning. Currently, this may entail feature sizes (e.g., width of ribbon 101) of about 180 nm to as low as 130 nm, but the physical characteristics of the components are amenable to even smaller feature sizes if manufacturing capabilities permit.

Figure 4:
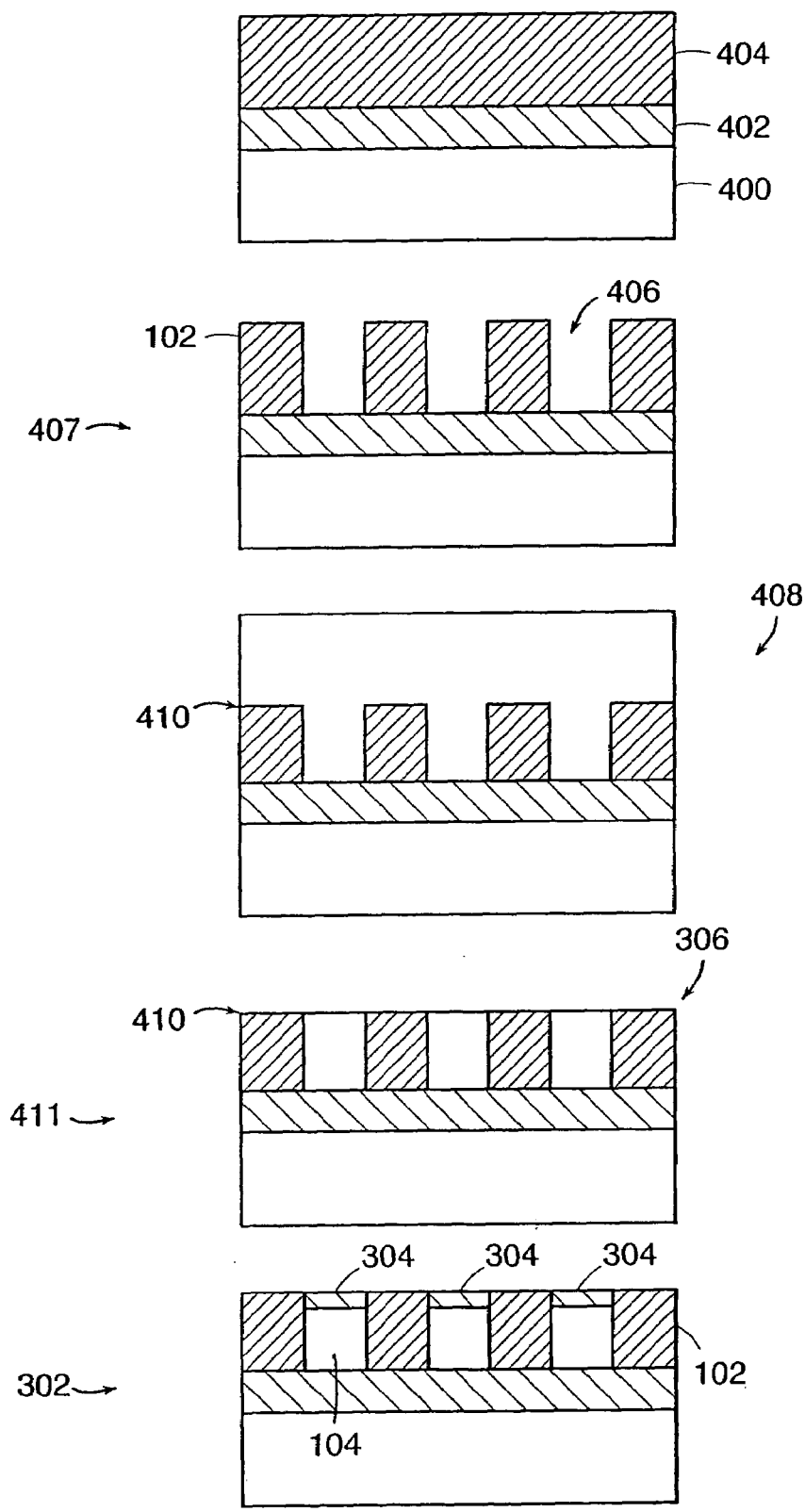

As will be explained below, there are many possible ways of creating the intermediate structures or analogous structures described above. FIG. 4, for example, shows one way to create the first intermediate structure 302

A silicon wafer 400 is provided with an oxide layer 402. The oxide layer is preferably a few nanometers in thickness but could be as much 1 μm. A silicon nitride ($Si_3N_4$) layer 404 is deposited on top of the oxide surface 402. The silicon nitride layer is preferably at least 30 nm thick.

The silicon nitride layer 404 is then patterned and etched to generate cavities 406 to form support structure 407. With modern techniques the cavity width may be about 180 nm wide or perhaps smaller. The remaining silicon nitride material defines the supports 102 (e.g., as row, or perhaps columns).

A covering 408 of n-doped silicon is then deposited to fill the cavities 406. The covering 408 for exemplary embodiments may be about 1 μm thick but may be as thin as 30 nm.

The covering 408 is then processed, for example by self-flattening of thick silicon layers or by annealing, to produce a planar surface 306, discussed above, to form structure 411. In the case of self-flattening, reactive ion-etching (RIE) with end-point detection (EPD) may be utilized until the upper surface 410 of the etched silicon nitride is reached.

The structure 411 is then oxidized to form and define sacrificial layers 304 of $SiO_2$ about 10–20 nm deep into planar surface 306.

The unconverted, remaining portions of silicon form traces 104.

Figure 5:
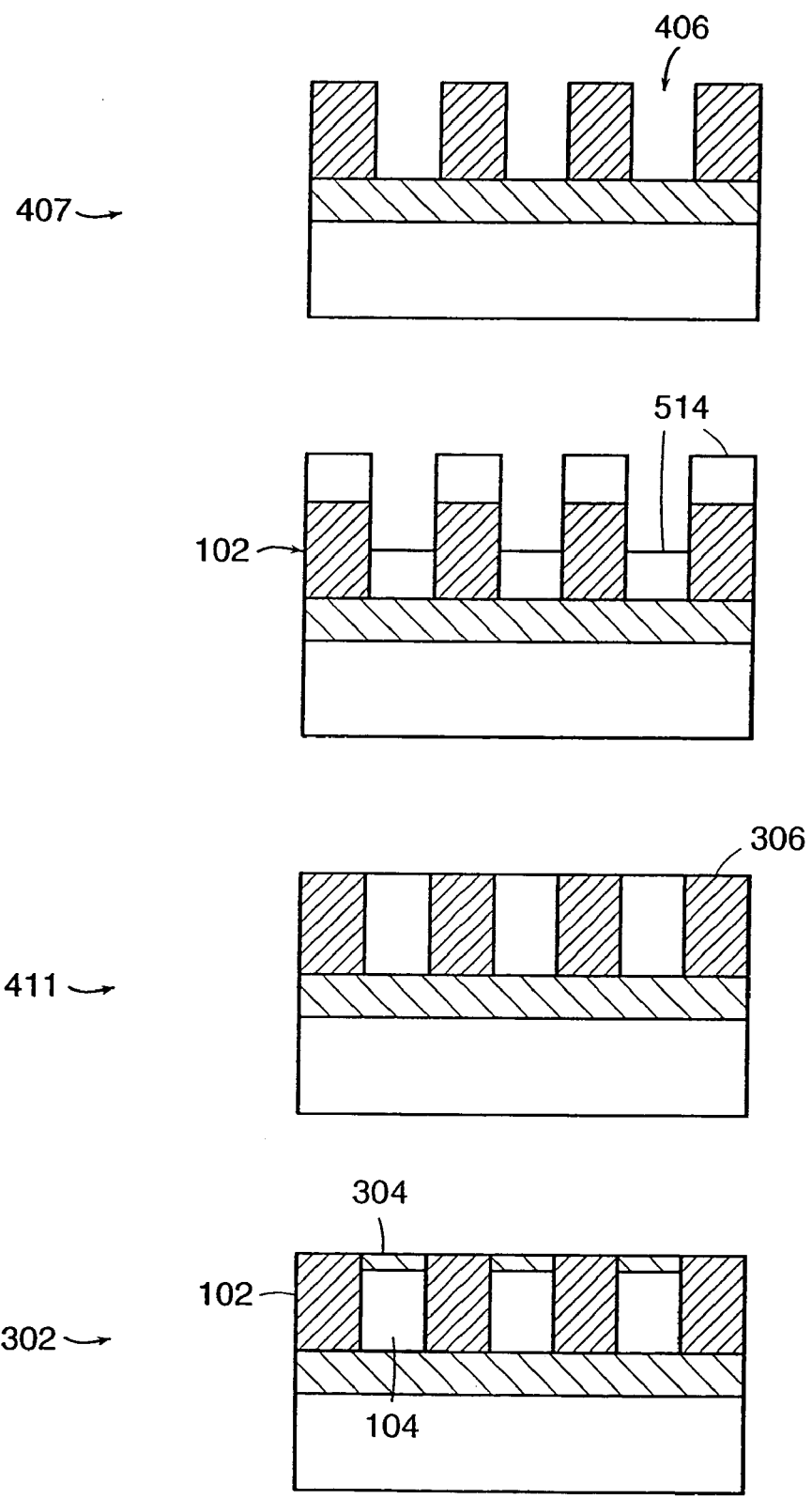

FIG. 5 shows another method that may be used to create the NTRCM devices 100 of certain embodiments. A support structure 407, like that described in connection with FIG. 4, is provided. A layer 514 of n-doped silicon is then added using a CVD process, sputtering or electroplating. Under certain embodiments, layer 514 is added to be about half the height of the $Si_3N_4$ supports 102.

After the layer 514 is added, an annealing step is performed to yield a planarized surface 306 to form a structure 411 like that described above. The annealing step causes the silicon of layer 514 to flow into the cavities 406.

Like that described in connection with FIG. 4, the structure 411 is then oxidized to form and define sacrificial layers 304 of $SiO_2$ about 10–20 nm deep into planar surface 306.

Figure 6:
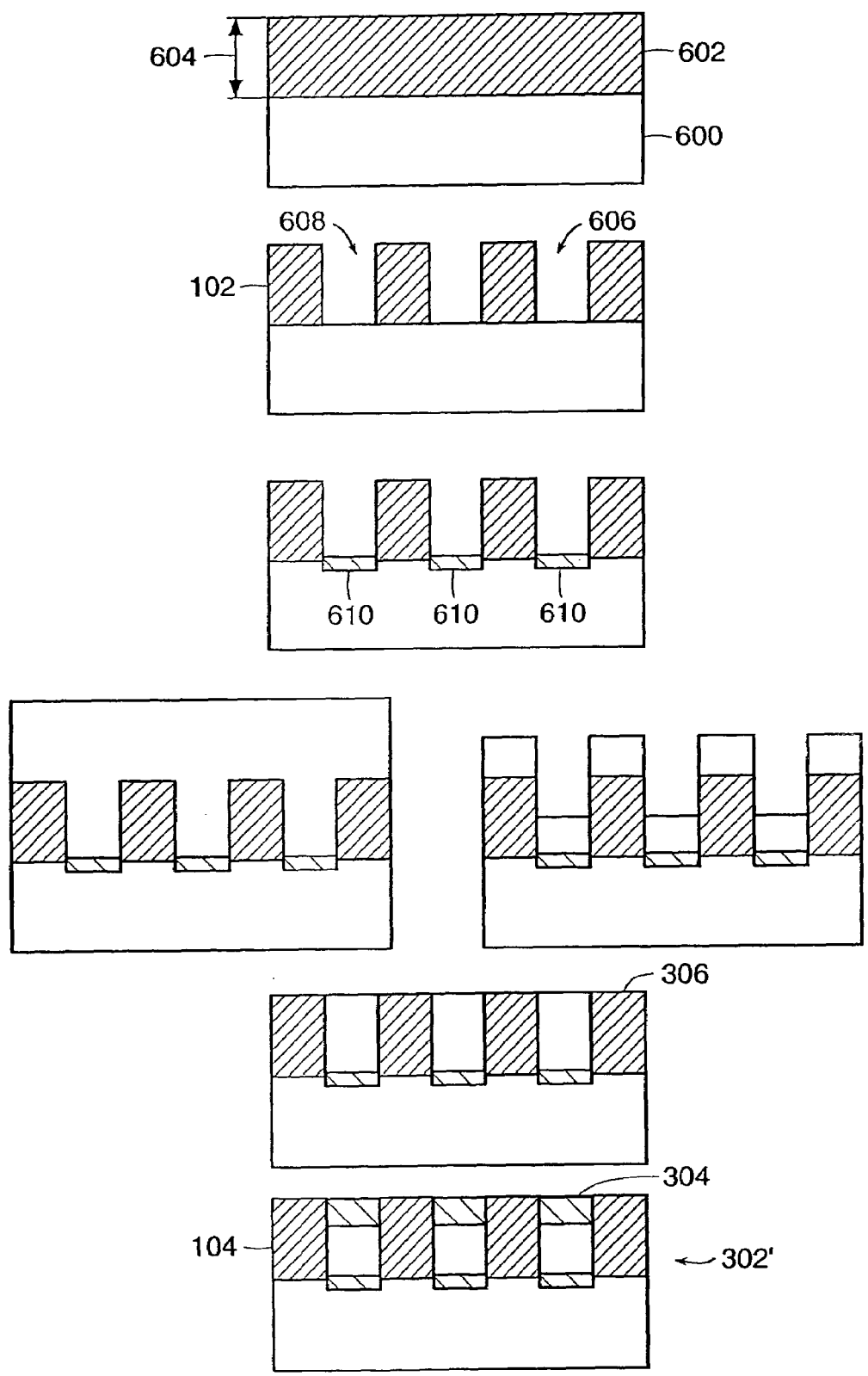

FIG. 6 shows another approach for forming an alternative first intermediate structure 302'. In this embodiment, a silicon substrate 600 is covered with a layer 602 of silicon nitride having a height 604 of at least 30 nm.

The silicon nitride layer 602 is then patterned and etched to generate spacings 606 and to defined supports 102. The etching process exposes a portion 608 of the surface of silicon substrate 600.

The exposed silicon surface 608 is oxidized to generate a silicon dioxide ($SiO_2$) layers 610 having a thickness of a few nm. These layers 610 eventually insulate traces 104 analogously to the way insulating layer 109 did for the above described structures 302.

Once the insulating layers 610 have been created, the traces 104 may be created in any of a variety of manner. FIG. 6 illustrates the processing steps of FIGS. 4–5 used to create such traces to illustrate this point.

Figure 7:
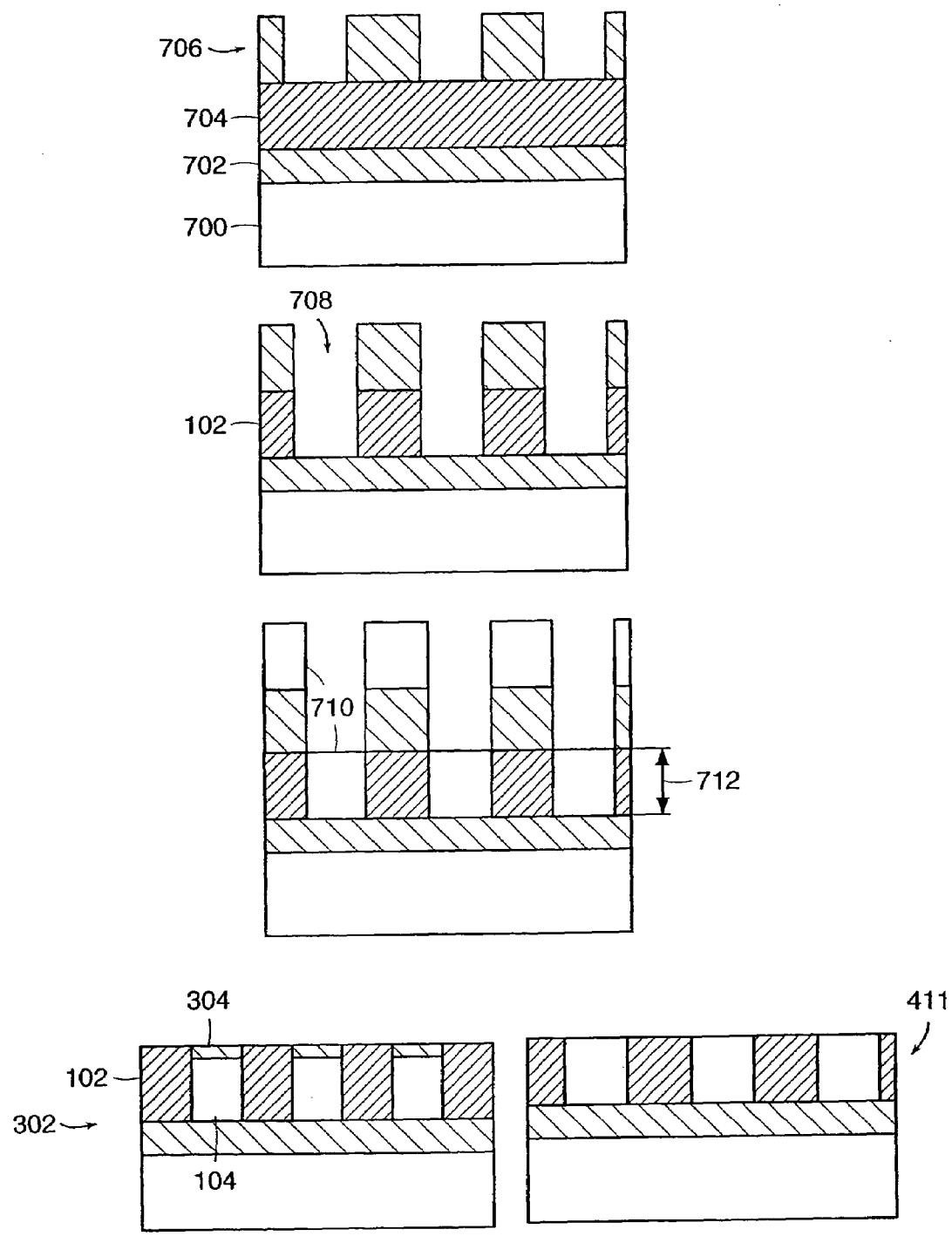

FIG. 7 shows another approach for forming first intermediate structure 302. A silicon substrate 700 having a silicon dioxide layer 702 and a silicon nitride layer 704 receives a patterned photoresist layer 706. For example, a photoresist layer may be spin-coated on layer 704 and subsequently exposed and lithographically developed.

Reactive ion etching (RIE) or the like may then be used to etch the $Si_3N_4$ layer 704 to form cavities 708 and to define supports 102.

Afterwards, n-doped silicon 710 may be deposited in the cavities 708. Under certain embodiments silicon is deposited to a height about equal to the height 712 of the $Si_3N_4$ supports 102.

The photoresist 706 and silicon 710 on top of the photoresist 706 are then stripped away to form an intermediate structure 411 like that described above.

The structure 411 is then oxidized to generate the sacrificial $SiO_2$ layers 304.

Figure 8:
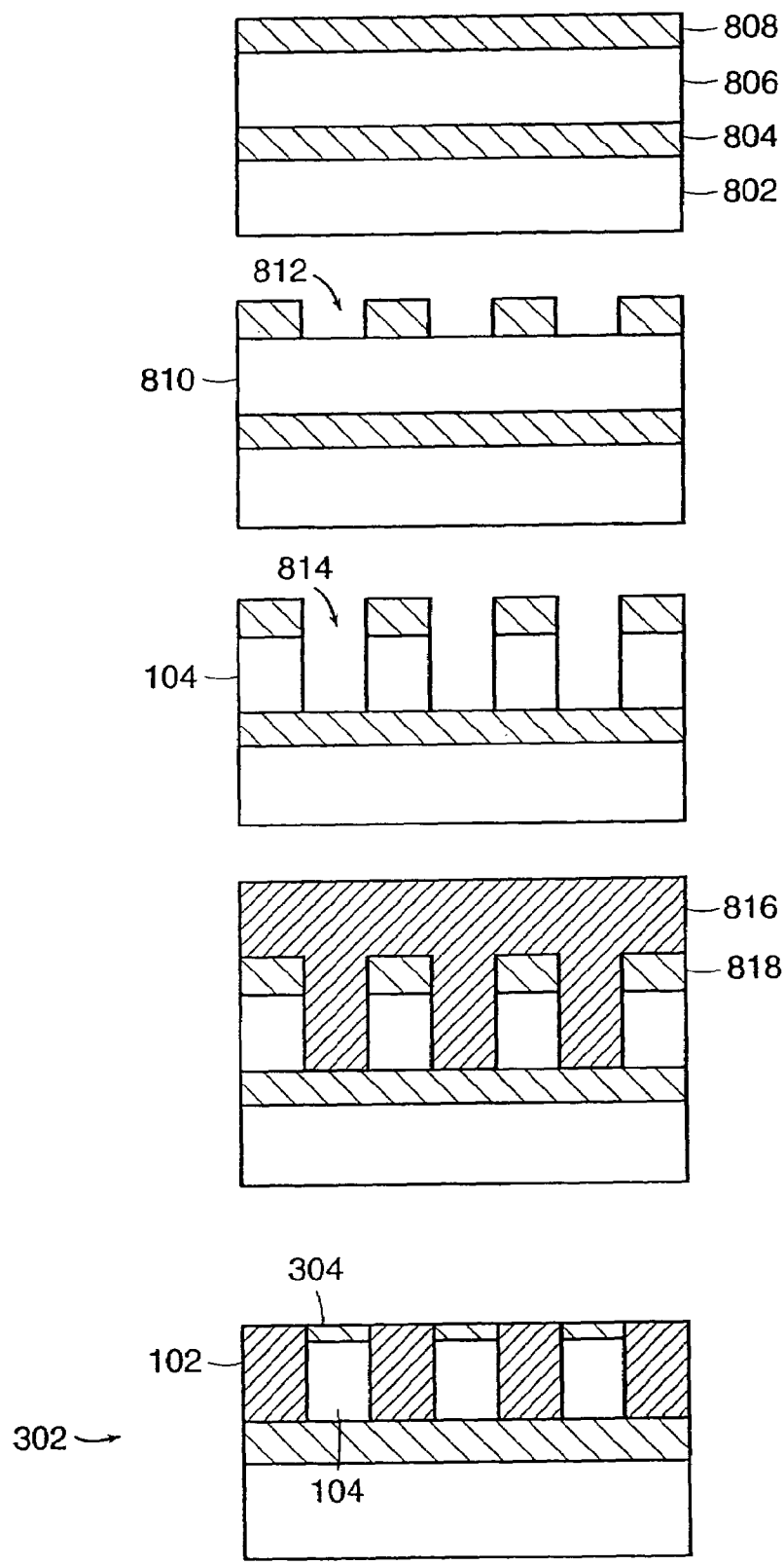

FIG. 8 shows another approach for forming first intermediate structure 302. Under this approach, a starting structure 800 is provided having a lowest silicon layer 802 with a lowest silicon dioxide layer 804 on top of it. A second silicon layer 806 is on top of layer 804 and a second silicon dioxide layer 808 is on top of the second silicon layer 806.

The top silicon dioxide ($SiO_2$) layer 808 is patterned by photolithography to create an RIE mask 810. The mask is used to etch the exposed portions 812 of second silicon layer 806 down to the first silicon dioxide layer 804. This etching creates cavities 814 and defines traces 104.

The cavities 814 are filled and covered with silicon nitride ($Si_3N_4$) 816.

The $Si_3N_4$ covering 816 is back etched with RIE to the same height 818 as the remaining portions of the $SiO_2$ layer 806 covering the n-doped silicon electrodes 104 (which form the sacrificial layer 304).

FIG. 9 shows an approach for forming an alternative first intermediate structure 302". Under this approach, a structure like 407 (shown in FIG. 4, but not FIG. 9) is provided. In this instance, the $Si_3N_4$ supports 102 have a height of about 30 nm. A thin layer of metal 902 is deposited on top of the $Si_3N_4$ supports 102 and on top of the exposed portions $SiO_2$ at the bottom of the cavities 904 as depicted by item 903. Metal 902 and 903 form temporary electrodes. A layer of n-doped silicon 906 may then be deposited or grown by electroplating, covering the electrode 903 until the silicon 906 achieves a height 908 at the top of the support 102 and contacting electrode 902. The growth process may be controlled by the onset of a current flow between the lower and upper metal electrodes 902,3.

The exposed metal electrodes 902 may then be removed by wet chemical methods or dry chemical methods. This forms an intermediate structure 411' like the structure 411 described above, but with a buried electrode 903, as an artifact of the silicon growing process.

The structure 411' is then oxidized to form sacrificial layers 304 at the exposed portions of silicon, as described above. For example, the layers 304 may be grown to a thickness of about 10 nm.

Figure 10:
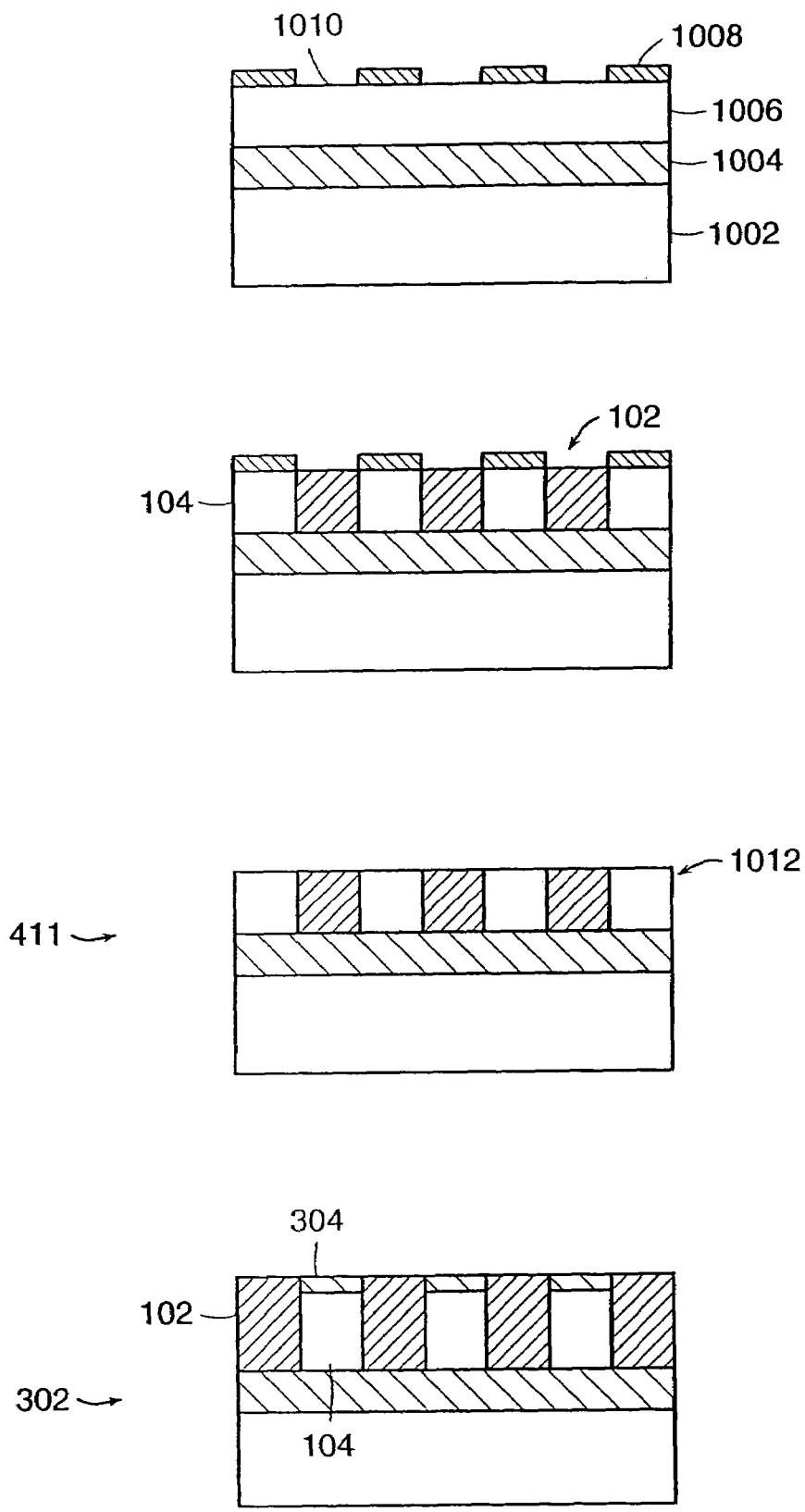

FIG. 10 shows another approach for forming first intermediate structure 302. A silicon substrate 1002 having a layer of silicon dioxide 1004 on top of it and a second layer 1006 of silicon (n-doped) on op of layer 1004 is used as a starting material. A mask layer 1008 is photolithographically patterned on top of layer 1006.

Using nitridization techniques, exposed portions 1010 of n-doped silicon layer 1006 are chemically converted to $Si_3N_4$ supports 102. The unconverted portions of layer 1006 form traces 104.

The mask 1008 is removed forming a structure 411 like that described above.

The exposed portions 1012 of silicon surface are then oxidized to form the $SiO_2$ sacrificial layers 304.

Figure 11:
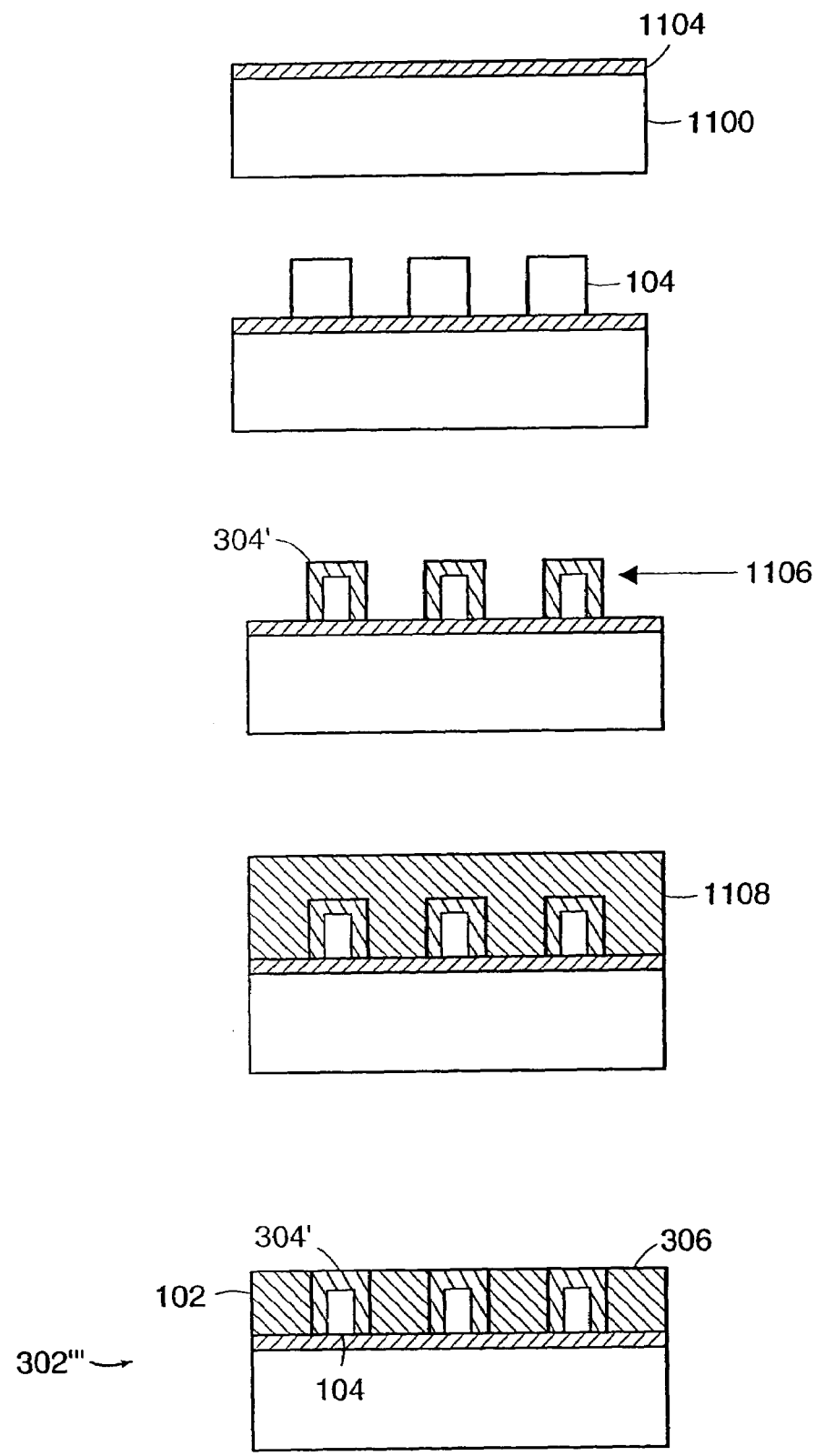

FIG. 11 shows an approach for forming an alternative first intermediate structure 302'''. Under this approach a silicon substrate 1102 is layered with a thin film 1104 of $Si_3N_4$ as a starting structure. On top of the silicon nitride layer 1104, n-doped silicon is added and lithographically patterned, by RIE to form traces 104.

The surfaces of traces 104 are oxidized to form the $SiO_2$ layer 1106 which acts as an alternative form of sacrificial layer 304'.

The structure is overgrown with $Si_3N_4$ 1108 and back etched to form a planar surface 306 and to form alternative first intermediate structure 302'''. As will be evident to those skilled in the art, under this approach, when the sacrificial layer is subsequently removed, traces 104 will be separated from supports 102. Other variations of this technique may be employed to create alternative transverse cross-sections of trace 104. For example, the traces 104 may be created to have a rounded top, or to have a triangular or trapezoidal cross section. In addition, the cross section may have other forms, such as a triangle with tapered sides.

As was explained above, once a first intermediate structure is formed, e.g., 302, a matted nanotube layer 312 is provided over the planar surface 306 of the structure 302. In preferred embodiments, the non-woven fabric layer 312 is grown over the structure through the use of a catalyst 308 and through the control of a growth environment. Other embodiments may provide the matted nanotube layer 312 separately and apply it directly over the structure 302. Though structure 302 under this approach preferably includes the sacrificial layer to provide a planar surface to receive the independently grown fabric, the sacrificial layer may not be necessary under such an approach.

Figure 12:
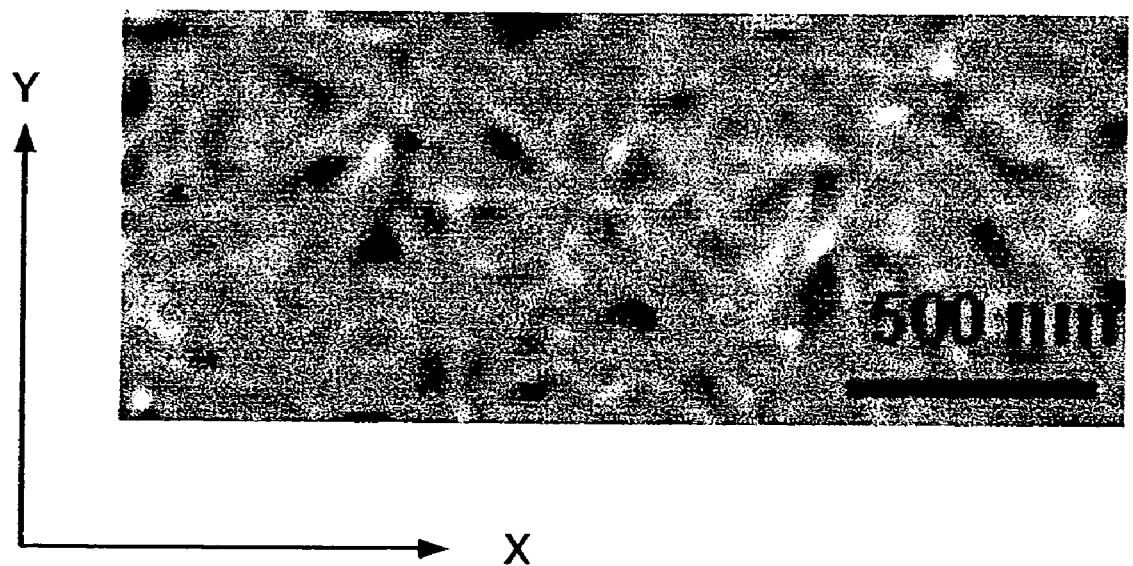
FIG. 12 illustrates the non-woven nanotube fabric, or matted nanotube layer, used to make certain embodiments of the invention.

Because the growth process causes the underside of such nanotubes to be in contact with planar surface 306 of intermediate structure 302, they exhibit a "self-assembly" trait as is suggested by FIG. 12. In particular, individual nanotubes tend to adhere to the surface on which they are grown whenever energetically favorable, such that they form substantially as a "monolayer." Some nanotubes may grow over another so the monolayer is not expected to be perfect. The individual nanotubes do not "weave" with one another but do adhere with one another as a consequence of Van der Waals forces. FIG. 12 is an approximate depiction of an actual nanotube non-woven fabric. Because of the small feature sizes of nanotube, even modern scanning electron microscopy cannot "photograph" an actual fabric without loss of precision; nanotubes have feature sizes as small as 1–2 nm which is below the precision of SEM. FIG. 12 for example, suggests the fabric's matted nature; not clear from the figure, however, is that the fabric may have small areas of discontinuity with no tubes present. Each tube typically has a diameter 1–2 nm (thus defining a fabric layer about 1–2 nm) but may have lengths of a few microns but may be as long as 200 microns. The tubes may curve and occasionally cross one another. Tubes attach to one another via Van der Waals forces.

In certain embodiments, nanotubes grow substantially unrestrained in the x- and y-axis directions, but are substantially restricted in the z-axis (perpendicular to page of FIG. 12) as a consequence of the self-assembly trait. Other embodiments may supplement the above approach to growing matte 312 with the use of field-oriented or flow-oriented growth techniques. Such supplementation may be used to further tailor growth such that any growth in one planar axis (e.g. the-x-axis) is retarded. This allows for a more even coverage of the desired area with a planar interwoven monolayer coating of nanotubes with a controllable density.

Figure 13:
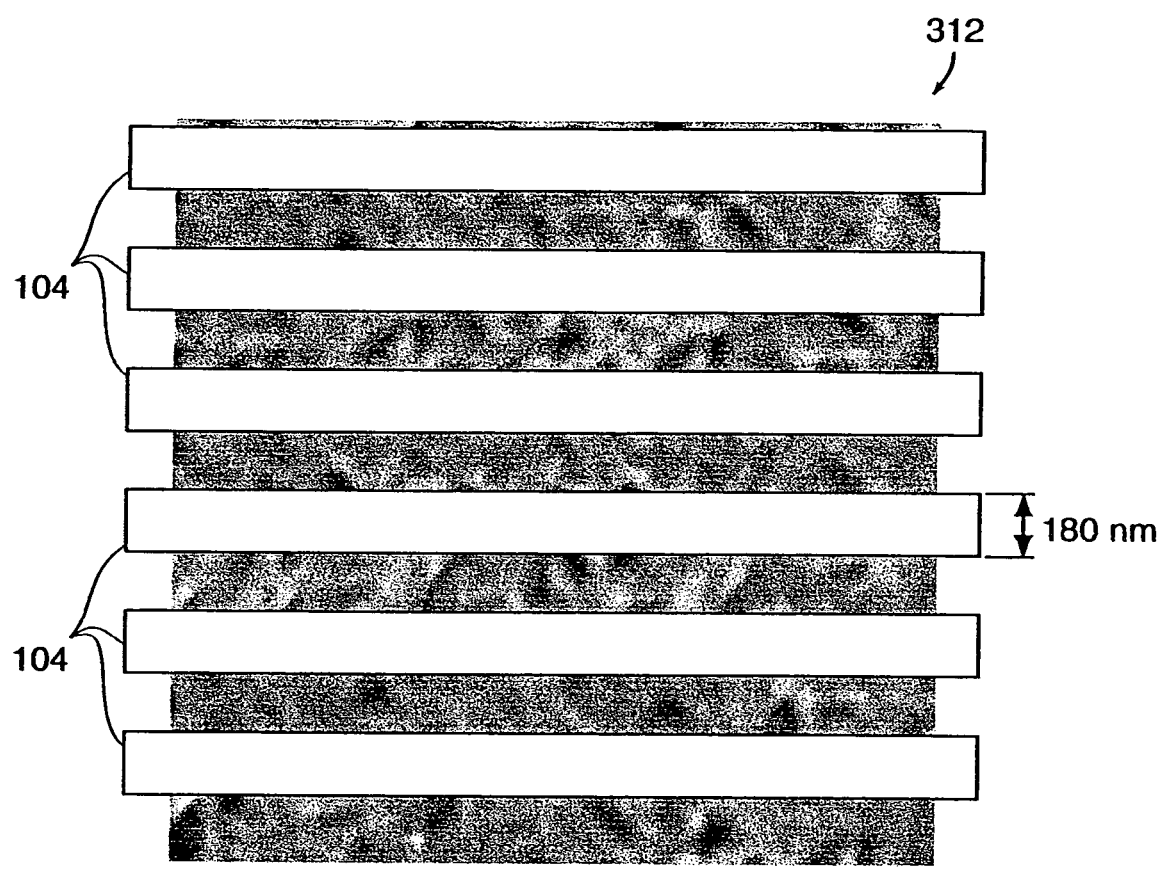
FIG. 13 illustrates the matted nanotube layer in relation to hidden, underlying traces of certain embodiments of the invention.

A plan view of the matted nanotube layer 312 with underlying silicon traces 104 is shown in FIG. 13.

As explained above, once the matted nanotube layer 312 is provided over the surface 306, the layer 312 is patterned and etched to define ribbons 101 of nanotube fabric that cross the supports 102. The sacrificial layer is then removed (e.g., with acid) forming the array 322 described above in connection with FIG. 3. Because the matted layer of nanotubes 312 form a non-woven fabric that is not a contiguous film, etchants or other chemicals may diffuse between the individual nanotube "fibers" and more easily reach the underlying components, such as the sacrificial layer.

Subsequent metalization may be used to form addressing electrodes, e.g., 112 shown in FIG. 1, as outlined above. Other embodiments use nanotube technology to implement addressing of memory cells instead of using metallized electrodes 112 and addressing lines (not shown).

More specifically, under certain embodiments described above, nanotubes are used to form NTRCM arrays. Certain embodiments use nanotube technology, whether in individual wire or belt form, to implement addressing logic to select the memory cell(s) for reading or writing operations. This approach furthers the integration of nanotube technology into system design and may provide beneficial functionality to higher-level system design. For example, under this approach the memory architecture will not only store memory contents in non-volatile manner but will inherently store the last memory address.

The nanotube-based memory cells have bistability characterized by a high ratio of resistance between "0" and "1" states. Switching between these states is accomplished by the application of specific voltages across the nanotube belt or wire and the underlying trace, in which at least one of the memory cell elements is a nanotube or a nanotube ribbon. In one approach, a "readout current" is applied and the voltage across this junction is determined with a "sense amplifier." Reads are non-destructive, meaning that the cell retains its state, and no write-back operations are needed as is done with DRAM.

Figure 14:
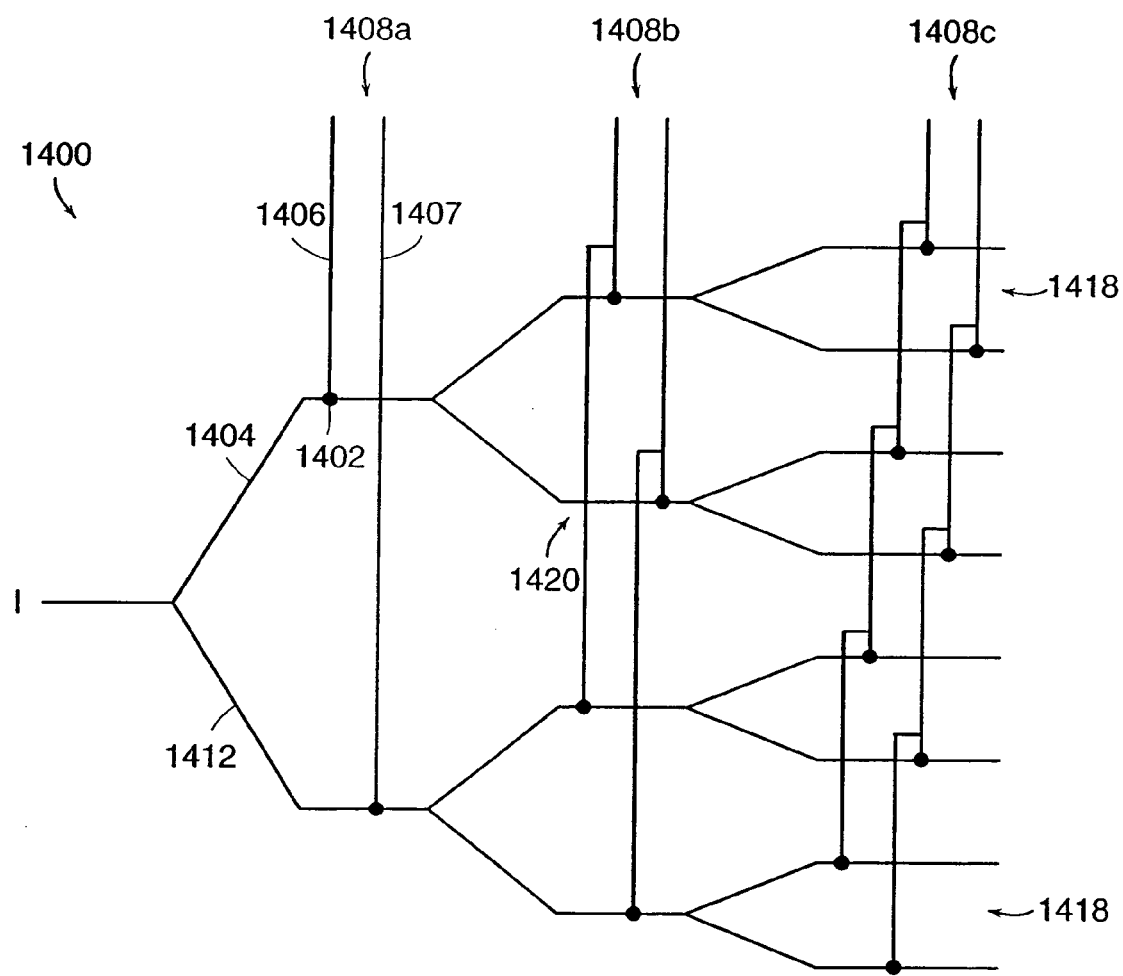
FIG. 14 illustrates addressing logic of certain embodiments of the invention.

FIG. 14 depicts a branching binary select system, or decoder, 1400. As will be explained below, decoder 1400 may be implemented with nanotubes or nanotube ribbon technology. Moreover, the decoder may be constructed on the same circuit component as a nanotube memory cell array, e.g., NTRCM or NTWCM.

A perpendicular intersection of two lines 1404 and 1406 depicted as a dot 1402 indicates a junction of two nanotubes or nanotube ribbons. In this regard, the interaction is analogous to a "pass transistor" found in CMOS and other technology, in which the intersection may be opened or closed.

Locations such as 1420 where one nanotube or nanotube ribbon may cross another but which are not intended to create a crossbar junction may be insulated from one another with a lithographically patterned insulator between the components.

For the sake of clarity, the decoder illustrated is for a 3-bit binary address carried on addressing lines 1408. Depending on the value of the encoding the intersections (dots) will be switched to create only one path through which sensing current I may pass to select lines 1418.

To use this technique, a "dual rail" representation 1408 of each bit of the binary address is fashioned externally so that each of the address bits 1410 is presented in true and complementary form. Thus, line 1406 may be the logical true version of address line 1408a and line 1407 may be the logical complement of address line 1408a. The voltage values of the representation 1408 are consistent with that needed to switch a crossbar junction to the "1" or "0" state as described above.

In this fashion an address 1408 may be used to supply a sense current I to a bit or row of bits in an array, e.g., to nanotubes or nanotube ribbons. Likewise, the same approach may be used to sense a given trace, for example, selecting specific array column(s) to read sense from in conjunction with selecting a row. Thus this approach may be used for X and/or Y decoding both for reading and for writing operations.

Figure 15:
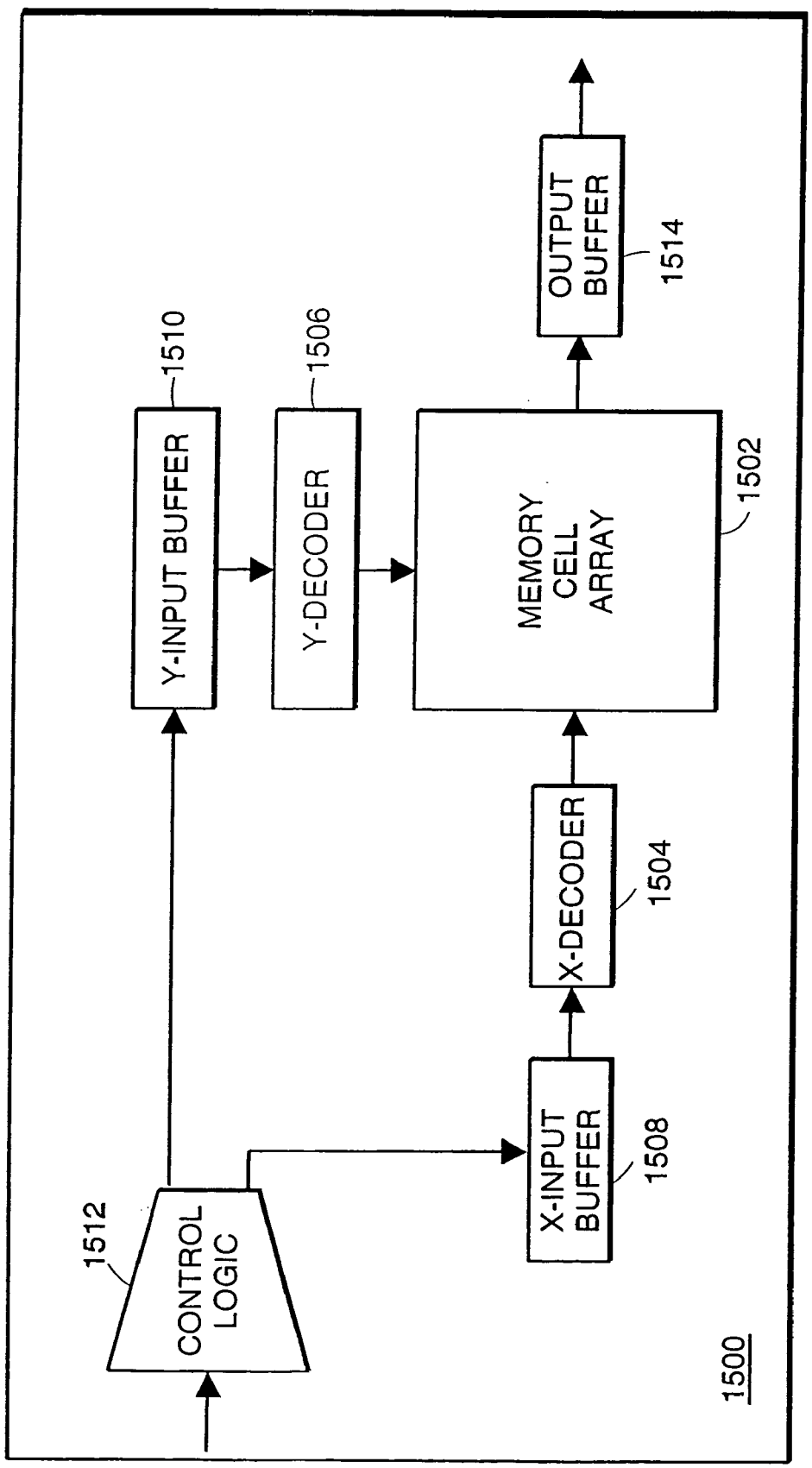
FIG. 15 illustrates a hybrid technology embodiment of the invention in which the memory core uses nanotube technology.

Certain embodiments of the invention provide a hybrid technology circuit 1500, shown in FIG. 15. A core memory cell array 1502 is constructed using NTWCM or NTRCM, and that core is surrounded by semiconductor circuits forming X and Y address decoders 1504 and 1506; X and Y buffers 1508 and 1510; control logic 1512 and output buffers 1514. The circuitry surrounding the NTWCM or NWBCM core may be used for conventional interfacing functions, including providing read currents and sensing output voltages.

In other embodiments, the X and Y address decoders 1504 and 1506 may be substituted with the nanotube wire or belt addressing technique discussed above. In these embodiments the core would include memory cells and addressing logic.

In certain embodiments, the hybrid circuit 1500 may be formed by using a nanotube core (having either just memory cells or memory cells and addressing logic) and by implementing the surrounding circuitry using a field programmable gate array. The core and gate array circuitry may be contained in a single physical package if desired. Or, they may be packaged separately. For example, a hermitically packaged nanotube circuit (having memory or memory and addressing logic) may be combined with a PLD/FPGA/ASIC in which the I/O interfacing logic is contained. The resulting compact chipset provides access to the benefits of the NT memory for the user of the product, while maximizing the use of "off-the-shelf" technologies, which may be utilized on an as-needed basis by the manufacturer.

Figure 16:
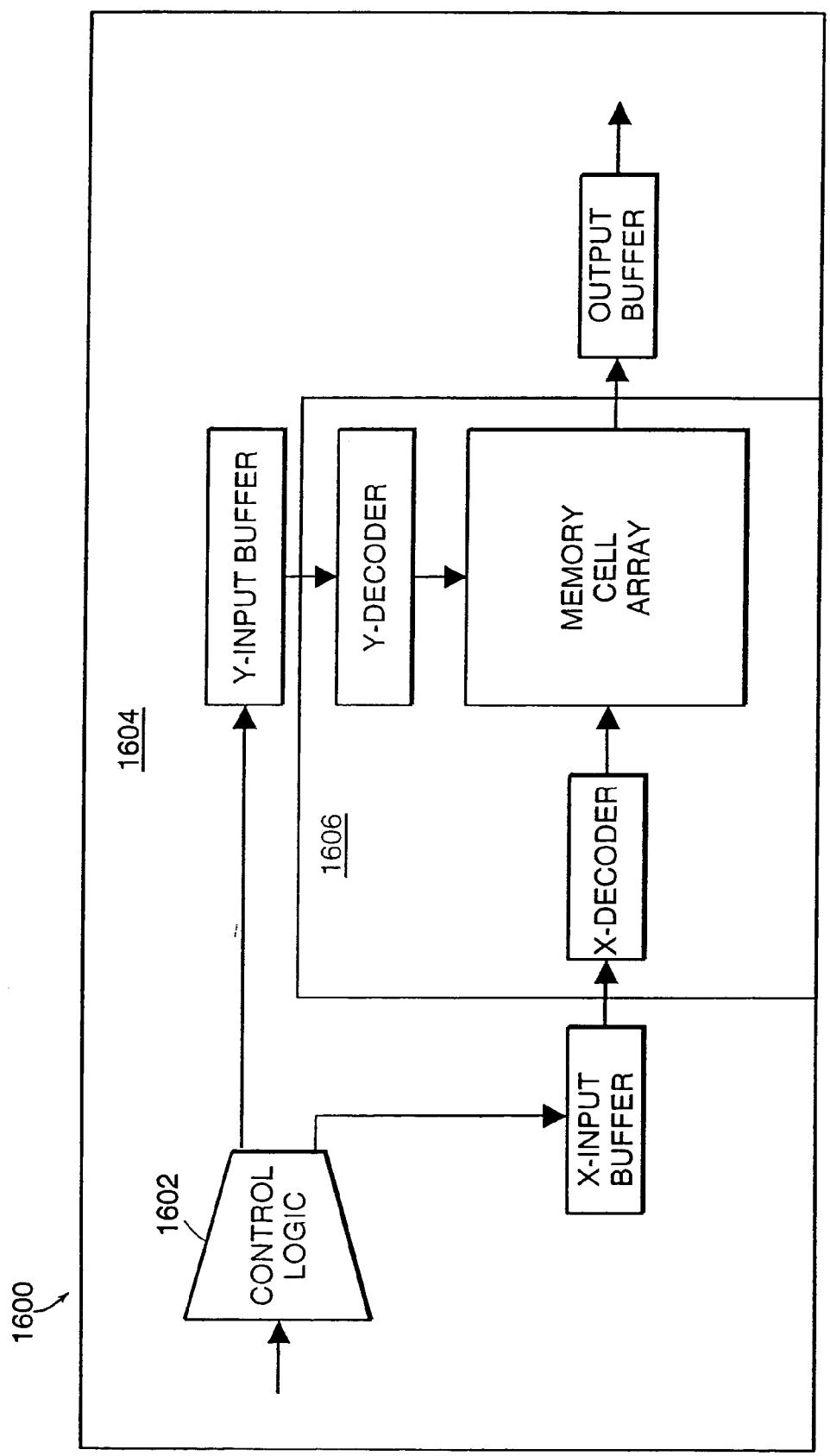
FIG. 16 illustrates a hybrid technology embodiment of the invention in which the memory core and addressing lines use nanotube ribbon technology.

FIG. 16 depicts one possible implementation 1600 of the hybrid technology. A FPGA chip 1602 containing the buffering and control logic (described above) is connected via conducting traces on a (perhaps multilayer) printed circuit board (PCB) 1604 to a nanotube (NT) chip 1606 containing the memory cells and addressing logic.

This particular embodiment is suggested to conform to the PCI bus standard, typical of today's personal computers. Other passive circuitry, such as capacitors, resistors, transformers, etc. (not pictured) would also be necessary to conform to the PCI standard. A front-side bus speed of 200 MHz–400 MHz is annotated, suggesting the kinds of external clock speeds such a chipset might run at. This speed is limited by the PCB interconnects and FPGA/PLD/ASIC speed, and also the chip packages, not the NT memory cell speed.

Other Embodiments

Besides carbon nanotubes other materials with electronic and mechanical properties suitable for electromechanical switching could be envisioned. These materials would have properties similar to carbon nanotubes but with different and likely reduced tensile strength. The tensile strain and adhesion energies of the material must fall within a range to allow bistability of the junction and electromechanical switching properties to exist within acceptable tolerances.

For the purpose of integrating CMOS logic for addressing two approaches can be envisioned. In the first embodiment the nanotube array will be integrated before metallization but after ion implantation and planarization of the CMOS logic devices. A second method involves growth of the nanotube arrays before fabrication of the CMOS devices involving ion implementation and high temperature annealing steps. Upon completion of these steps the final metallization of both the nanotube ribbons and the CMOS devices will proceed using standard and widely used protocols.

Electrodes consisting of n-doped silicon on top of some metal or semiconductor line can also be envisioned. This will still provide rectifying junctions in the ON state so that no multiple current pathways exist.

In addition to rectifying junctions, there are other widely accepted and used methods to prevent the occurrence of electrical crosstalk (i.e. multiple current pathways) in crossbar arrays. Tunnel barriers on top of the static, lithographically fabricated electrodes prevent the formation of ohmic ON states. No leakage currents at zero bias voltage will occur but a small bias voltage has to be applied for the charge carriers to overcome this barrier and tunnel between the crossing lines.

Methods to increase the adhesion energies through the use of ionic, covalent or other forces can be envisioned to alter the interactions with the electrode surfaces. These methods can be used to extend the range of bistability with these junctions.

Nanotubes can be functionalized with planar conjugated hydrocarbons such as pyrenes which may then aid in enhancing the internal adhesion between nanotubes within the ribbons.

Certain of the above aspects, such as the hybrid circuits and the nanotube technology for addressing, are applicable to individual nanotubes (e.g., using directed growth techniques, etc.) or to nanotube ribbons.

It will be further appreciated that the scope of the present invention is not limited to the above-described embodiments but rather is defined by the appended claims, and that these claims will encompass modifications of and improvements to what has been described.

What is claimed is:

1. A hybrid memory circuit, comprising:
   a substrate;
   an electrically conductive trace disposed on the substrate;
   a deflectable article having at least one nanotube disposed in spaced separation relative to the conductive trace, and wherein the position of the deflectable article represents a memory state of the memory circuit; and
   an electronic selection circuit for selecting the deflectable article for operation in response to receiving a memory cell address.

2. A hybrid memory system, comprising:
   an arrangement of memory cells, each memory cell having a nanotube element for storing memory states, wherein the nanotube element comprises a nanotube switch having a portion of nanotube fabric, the nanotube fabric comprising a plurality of nanotubes, and wherein the nanotube switch is capable of switching states in which different switch states correspond to different memory states;
   a cell selector circuit for receiving memory address information and for selecting at least one corresponding cell in response thereto, the cell selector circuit being constructed of transistors.

3. The hybrid memory circuit of claim 1, wherein the deflectable article is a nanotube ribbon.

4. The hybrid memory circuit of claim 1, wherein the deflectable article comprises a nanotube fabric, the nanotube fabric having a plurality of unaligned nanotubes.

5. The hybrid memory circuit of claim 1, wherein the electronic selection circuit receiving the memory cell address comprises receiving electrical stimulus applied to at least one address line.

6. The hybrid memory circuit of claim 1, wherein the electronic selection circuit comprises at least one transistor.

7. The hybrid memory circuit of claim 1, wherein the electronic selection circuit comprises at least one field programmable semiconductor device responsive to memory cell address information electrically transmitted on at least one address line.

8. The hybrid memory circuit of claim 1, wherein the deflectable article is capable of nonvolatilely retaining the position representing a memory state of the memory circuit.

9. The hybrid memory circuit of claim 1, the deflectable article having a first and a second position representing a first and a second memory state of the memory circuit, respectively, wherein in the first position the deflectable article is in electrical communication with the conductive trace and wherein in the second position the deflectable article is not in electrical communication with the conductive trace.

* * * * *